United States Patent
Kang

(10) Patent No.: US 8,248,858 B2
(45) Date of Patent: *Aug. 21, 2012

(54) FLASH MEMORY DEVICE AND SYSTEMS AND READING METHODS THEREOF

(75) Inventor: Sanggu Kang, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/137,437

(22) Filed: Aug. 16, 2011

(65) Prior Publication Data

US 2011/0299342 A1    Dec. 8, 2011

Related U.S. Application Data

(63) Continuation of application No. 12/458,798, filed on Jul. 23, 2009, now Pat. No. 8,023,335.

(30) Foreign Application Priority Data

Sep. 19, 2008 (KR) .................. 10-2008-0092251

(51) Int. Cl.
*G11C 11/34* (2006.01)
(52) U.S. Cl. ............... 365/185.25; 365/185.24
(58) Field of Classification Search ............ 365/185.24, 365/185.25
See application file for complete search history.

(56) References Cited

U.S. PATENT DOCUMENTS

| 6,031,760 | A * | 2/2000 | Sakui et al. ............. 365/185.21 |
| 6,922,365 | B2 * | 7/2005 | Beer ....................... 365/189.05 |
| 7,196,946 | B2 | 3/2007 | Chen et al. |
| 8,023,335 | B2 * | 9/2011 | Kang ...................... 365/185.25 |
| 2005/0162913 | A1 | 7/2005 | Chen |
| 2006/0221683 | A1 | 10/2006 | Chen et al. |
| 2006/0279977 | A1 * | 12/2006 | Shiga et al. ................ 365/145 |
| 2007/0002632 | A1 | 1/2007 | Okayama et al. |
| 2007/0159881 | A1 | 7/2007 | Sato et al. |
| 2007/0291546 | A1 * | 12/2007 | Kamei ..................... 365/185.22 |
| 2008/0084755 | A1 * | 4/2008 | Mokhlesi ................ 365/185.21 |
| 2008/0158973 | A1 * | 7/2008 | Mui et al. ................ 365/185.18 |
| 2008/0219059 | A1 | 9/2008 | Li |
| 2008/0225600 | A1 * | 9/2008 | Park ........................ 365/185.25 |

FOREIGN PATENT DOCUMENTS

| JP | 2007-184040 | 7/2007 |
| JP | 2007-519162 | 7/2007 |
| KR | 10-2007-0007283 | 1/2007 |
| KR | 10-2007-0074477 | 7/2007 |
| KR | 10-2008-0016545 | 2/2008 |
| WO | WO 2005/073978 | 8/2005 |

* cited by examiner

*Primary Examiner* — Michael Tran
(74) *Attorney, Agent, or Firm* — Harness, Dickey & Pierce, P.L.C.

(57) ABSTRACT

A read method of a flash memory device is provided which comprises reading a plurality of adjacent memory cells connected with a word line different from a plurality of selected memory cells; reading the plurality of selected memory cells one or more times using a plurality of coupling compensation parameters; and selectively latching the read result of the selected memory cells based on the read result of the adjacent memory cells.

20 Claims, 18 Drawing Sheets

Programmed Memory Cell
(WL_i)

Memory Cell To Be Programmed
(WL_{i+1})

FLASH MEMORY DEVICE AND SYSTEMS AND READING METHODS THEREOF

FOREIGN PRIORITY STATEMENT

This application is a continuation of and claims priority under 35 U.S.C. §§120/121 to U.S. patent application Ser. No. 12/458,798, filed on Jul. 23, 2009 now U.S. Pat. No. 8,023,335, which claims priority under 35 U.S.C §119 to Korean Patent Application No. 10-2008-0092251 filed on Sep. 19, 2008, in the Korean Intellectual Property Office (KIPO), the contents of each of which are incorporated herein by reference.

BACKGROUND

The present invention relates to a nonvolatile semiconductor memory device. More particularly, the present invention relates to a nonvolatile memory device and systems and a reading method thereof Semiconductor memory devices may be roughly classified into volatile memory devices and nonvolatile memory devices.

In case of the volatile memory devices, their reading and writing speeds are fast, while they have such a disadvantage that stored contents therein disappear at power-off On the other hand, in case of the nonvolatile memory devices, stored contents therein are retained even at power-off. For this reason, the nonvolatile semiconductor memory devices may be used to retain contents to be reserved irregardless of whether a power is supplied. The nonvolatile semiconductor memory devices may include Mask Read-Only Memory (MROM), Programmable ROM (PROM), Erasable Programmable ROM (EPROM), Electrically Erasable Programmable ROM (EEPROM), and the like.

In general, the MROM, PROM, and EPROM are not free to be erased and written by a system itself, so that it is not easy for general users to update stored contents. On the other hand, EEPROM is capable of being electrically erased or written. Application of the EEPROM is widened to an auxiliary memory or to system programming where continuous updates are needed (flash EEPROM). In particular, a flash EEPROM (hereinafter, referred to as a flash memory) exhibits a higher degree of integration than a conventional EEPROM and thus is advantageous in large auxiliary memory applications.

Flash memories may be divided into a NAND flash memory and a NOR flash memory according to interconnections of memory cells and bit lines. The NOR flash memory consumes a much amount of current, so that it is not unfavorable for a high degree of integration. On the other hand, the NOR flash memory is advantageous for a high speed. The NAND flash memory consumes an amount of cell current less than the NOR flash memory, so that it is advantageous for a high degree of integration.

Each of memory cells of a flash memory has a floating gate or a charge trap layer between a bulk region and its control gate. The flash memory stores data by adjusting a threshold voltage of a memory cell via accumulation or trapping of charge on or in its floating gate or charge trap layer. This operation is so-called referred to as a write or program operation.

Each of programmed memory cells has one of threshold voltage distributions each corresponding to N program states or programmed data values (N being an integer greater than or equal to 2). At a program operation, the coupling may arise between a selected memory cell and adjacent memory cells. The coupling causes widening of each of threshold voltage distributions each corresponding to program states and narrowing of an interval between adjacent program states. Such coupling is referred to as the electric field coupling or F-poly coupling.

As due to the coupling, a variation of threshold voltages of adjacent memory cells is large and an interval between adjacent program states is narrowed, it is difficult to read out data from memory cells reliably. As the number of bits stored per cell increases, such a phenomenon may increase more and more.

SUMMARY

Example embodiments are directed to provide a flash memory device and multi-block erasing method enhancing reliability of memory cells.

One aspect of example embodiments provides a read method of a flash memory device which comprises reading a plurality of adjacent memory cells connected with a word line different from a plurality of selected memory cells; reading the plurality of selected memory cells one or more times using a plurality of coupling compensation parameters; and selectively latching the read result of the selected memory cells based on the read result of the adjacent memory cells.

Another aspect of the example embodiments provides a read method of a flash memory device which comprises reading a plurality of adjacent memory cells connected with a different word line from a plurality of selected memory cells; reading selected memory cells each corresponding to adjacent memory cells having a first data value, using a first coupling compensation parameter; reading selected memory cells each corresponding to adjacent memory cells having a second data value, using a second coupling compensation parameter; latching results read from the memory cells to which the second coupling compensation parameter is applied; reading selected memory cells each corresponding to adjacent memory cells having a third data value, using a third coupling compensation parameter; latching results read from the memory cells to which the third coupling compensation parameter is applied; reading selected memory cells each corresponding to adjacent memory cells having a fourth data value, using a fourth coupling compensation parameter; and latching results read from the memory cells to which the fourth coupling compensation parameter is applied.

Another aspect of the example embodiments provides a read method of a flash memory device which comprises reading a plurality of adjacent memory cells connected with a different word line from a plurality of selected memory cells; reading the selected memory cells using a first coupling compensation parameter; latching one, corresponding to an adjacent memory cell having a first data value, from the read results of the selected memory cells; reading the selected memory cells using a second coupling compensation parameter; latching one, corresponding to an adjacent memory cell having a second data value, from the read results of the selected memory cells; reading the selected memory cells using a third coupling compensation parameter; latching one, corresponding to an adjacent memory cell having a third data value, from the read results of the selected memory cells; reading the selected memory cells using a fourth coupling compensation parameter; and latching one, corresponding to an adjacent memory cell having a fourth data value, from the read results of the selected memory cells.

Yet another aspect of the example embodiments provides a read method of a flash memory device which comprises reading a plurality of adjacent memory cells connected with a different word line from a plurality of selected memory cells; reading the selected memory cells using a first coupling compensation parameter; latching the read results to which the first coupling compensation parameter is applied; reading the selected memory cells using a second coupling compensation parameter; latching the read results to which the second coupling compensation parameter is applied; reading the selected memory cells using a third coupling compensation parameter; latching the read results to which the third coupling compensation parameter is applied; reading the selected memory cells using a fourth coupling compensation parameter; and latching the read results to which the fourth coupling compensation parameter is applied.

Still another aspect of the example embodiments provides a read method of a flash memory device which comprises reading a plurality of adjacent memory cells connected with a different word line from a plurality of selected memory cells; determining coupling compensation parameters each to be applied to the selected memory cells, based on the read results of the adjacent memory cells; reading the selected memory cells using the coupling compensation parameters to be applied to respective selected memory cells; and latching the read results.

Still another aspect of the example embodiments provides a flash memory device which comprises a memory cell array having a plurality of memory cells; and a page buffer circuit configured to read selected memory cells at least one or more by adjusting either a level of a pre-charge voltage of each of bit lines each connected with the selected memory cells or a length off a sensing period for sensing a voltage of each bit line, wherein the page buffer circuit is configured to selectively latch read results of the selected memory cells based on read results of a plurality of adjacent memory cells connected with a different word line from the selected memory cells.

Still another aspect of the example embodiments provides a memory system which comprises a flash memory device; and a controller configured to control the flash memory device, wherein the flash memory device comprises a memory cell array having a plurality of memory cells; and a page buffer circuit configured to read selected memory cells one or more times by adjusting either a level of a pre-charge voltage of each of bit lines each connected with the selected memory cells or a length of a sensing period for sensing a voltage of each bit line, wherein the page buffer circuit is configured to selectively latch read results of the selected memory cells based on read results of a plurality of adjacent memory cells connected with a different word line from the selected memory cells.

Still other aspect of the example embodiments provides a computing system which comprises a host; a flash memory device; and a controller configured to control the flash memory device according to a request of the host, wherein the flash memory device comprises: a memory cell array having a plurality of memory cells; and a page buffer circuit configured to read selected memory cells one or more times by adjusting either a level of a pre-charge voltage of each of bit lines each connected with the selected memory cells or a length off a sensing period for sensing a voltage of each bit line, wherein the page buffer circuit is configured to selectively latch read results of the selected memory cells based on read results of a plurality of adjacent memory cells connected with a different word line from the selected memory cells.

BRIEF DESCRIPTION OF THE FIGURES

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF THE EMBODIMENTS

Figure 1:
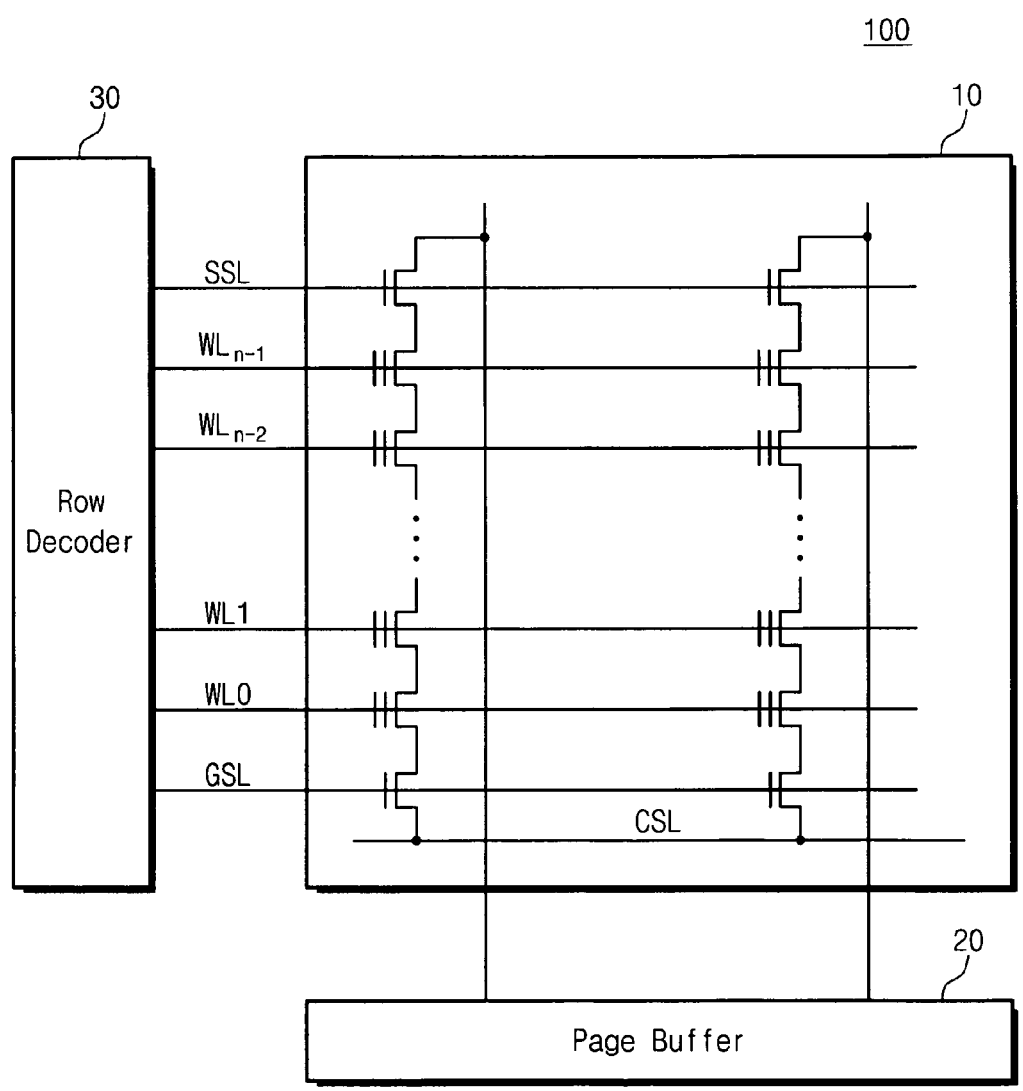
FIG. 1 is a diagram showing schematic configuration of a flash memory device according to one example embodiment.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

A reading method of a flash memory device according to example embodiments is capable of removing the coupling effect of memory cells connected with a word line different from a selected word line. For this, first of all, a reading operation is made with respect to memory cells connected with an adjacent word line before reading of selected memory cells. At least one or more reading operations may be carried out with respect to a selected memory cell with the coupling compensation parameters (e.g., a bit line pre-charge voltage or the length of a sensing period) being varied. The result of the at least one or more reading operations for the selected memory cell may be selectively latched according to program states of memory cells connected with a different word line. Below, a flash memory device and its reading method according to example embodiments will be more fully described with reference to the accompanying drawings.

FIG. 1 is a diagram showing schematic configuration of a flash memory device according to one example embodiment.

Referring to FIG. 1, a flash memory device 100 includes a cell array 10, a page buffer circuit 20, and a row decoder circuit 30. The cell array 10 may be formed of a plurality of memory blocks, each of which includes memory cells arranged in a plurality of rows (or, word lines WL0 to WLn−1) and a plurality of columns (or, bit lines BL0 to BLm−1). Memory cells are arranged to have a NAND string structure as illustrated in FIG. 1. But, the memory cells are able to be arranged to have a NOR structure although not shown in figures.

The rows of the cell array 10 are driven by the row decoder circuit 30, and the columns are driven by the page buffer circuit 20. Each of the memory cells may store 1-bit data or multi-bit data (e.g., two- or more-bit data). A memory cell storing 1-bit data is called a single-bit cell or a single-level cell (SLC), and a memory cell storing multi-bit data is called a multi-bit cell, a multi-level cell (MLC), or a multi-state cell. It is possible to form each memory block so as to have single-level cells and multi-level cells simultaneously.

A reading operation carried out by the page buffer circuit 20 includes a normal reading operation and a verify reading operation. The reading operation may be made by a unit of one or more pages with respect to a plurality of memory cells which are connected with a selected word line. The page buffer circuit 20 operates as a sense amplifier for reading data from memory cells at a reading operation and as a driver for driving bit lines according to data to be programmed at a programming operation. The page buffer circuit 20 may include a plurality of page buffers each of which correspond to one bit line or a pair of bit lines.

As will be described below, the page buffer circuit 20 according to example embodiments may adjust the coupling compensation parameters (e.g., a sensing time, a level of a bit line pre-charge voltage, etc.) with reference to program states of memory cells (hereinafter, referred to as adjacent memory cells) which are connected with a word line (e.g., WLi+1) (hereinafter, referred to as an adjacent word line) adjacent to a selected word line (e.g., WLi). The coupling compensation parameters are used to compensate the effect of coupling caused between adjacent memory cells at a reading operation. In accordance with the above-described reading method, accurate reading is made although a distribution of threshold voltages of adjacent memory cells is varied due to the electric field coupling/F-poly coupling.

Below, examples of an MLC flash memory with a NAND string structure will be described. But, the configurations and operating characteristics of the flash memory to be described below are not limited to specific memory structures. For example, the configurations and operating characteristics of the flash memory to be described below are able to be applied all of a NAND flash memory device and a NOR flash memory device. Further, they are capable of being applied to various types of flash memory devices regardless of a structure of a charge storing layer of a flash memory device. Program states of memory cells connected with an adjacent word line WLi+1 to a selected word line WLi will be described as an element of the coupling considered to compensate the coupling effect. But, it is comprehended that there are considered various elements, such as memory cells arranged at a different place, a variation of a threshold voltage due to programming of a selected memory cell itself, etc., effecting the coupling.

Figure 2:
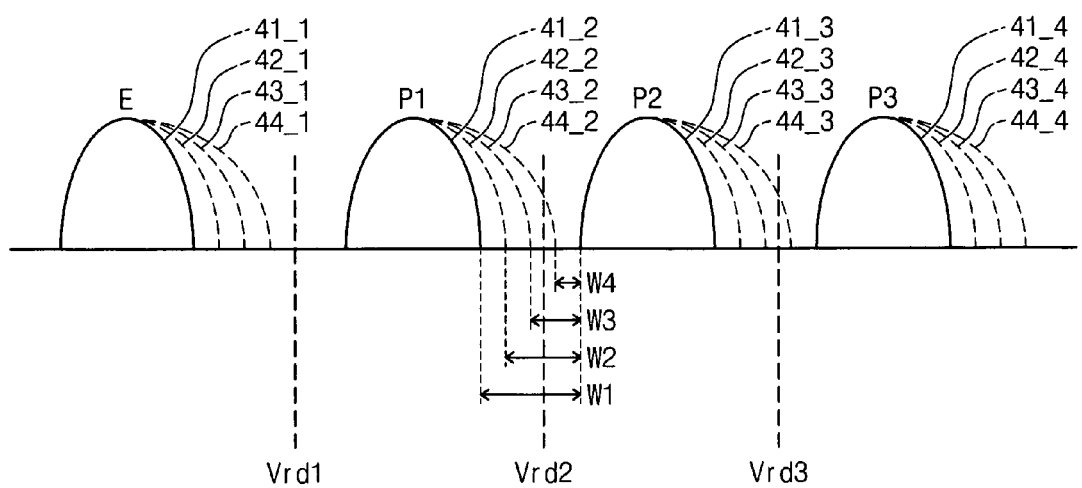
FIGS. 2 and 3 are diagrams for describing the electric field coupling or F-poly coupling caused between adjacent memory cells.
Figure 3:
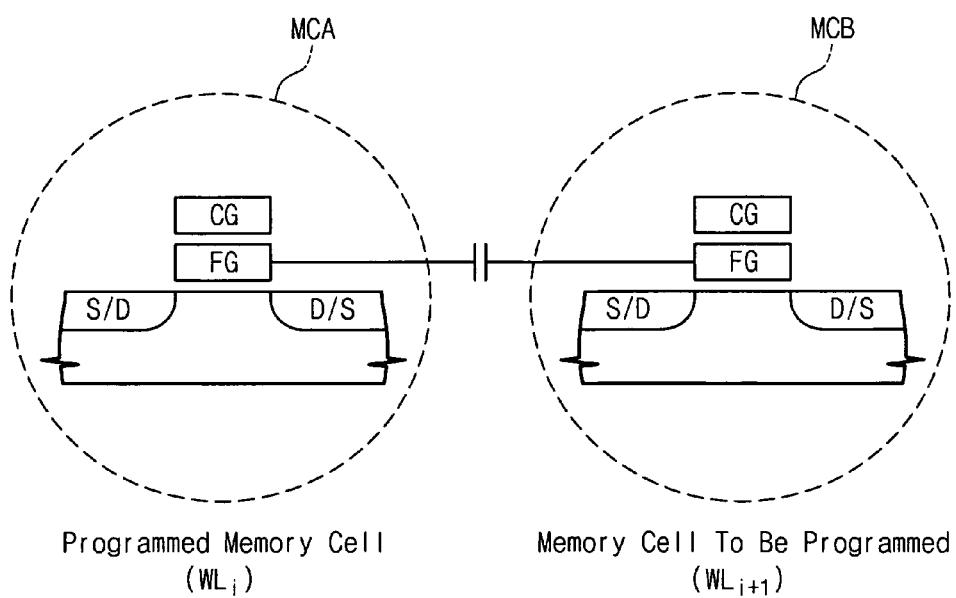

FIGS. 2 and 3 are diagrams for describing the electric field coupling or F-poly coupling caused between adjacent memory cells.

FIG. 2 shows threshold voltage distributions of multi-level cells, for example, 2-bit cells that 2-bit data is stored in one cell. In a case where 2-bit data is stored in one memory cell, a memory cell has a threshold voltage in one of four threshold voltage distributions E, P1, P2, and P3, which correspond to data states of '11', '10', '00' and '01', respectively.

In FIG. 2, solid lines 41_1, 41_2, 41_3 and 41_4 indicate the cases that threshold voltage distributions corresponding to four data states exist within given threshold voltage windows. In this case, it is apprehended that threshold voltage distributions of adjacent data states are arranged appropriately with a given margin W1. Threshold voltage distributions are controlled finely such that threshold voltage distributions corresponding to four data states exist within given threshold voltage windows, respectively. For this, there has been proposed a programming method using the Incremental Step Pulse Programming (ISPP) scheme. In accordance with the ISPP scheme, a threshold voltage of a memory cell is shifted by the increment of a program voltage applied for each program loop. Therefore, it is possible to control a threshold voltage of a memory cell more finely by setting the increment of a program voltage less. This means that the margin WI between data states is secured sufficiently. But, notwithstanding this ISPP scheme, a threshold voltage distribution corresponding to each data state may be varied due to the electric field coupling or F-poly coupling.

Referring to FIG. 3, it is assumed that a memory cell MCA is a memory cell which is programmed to have one of four states and that it is connected with an ith word line WLi. It is assumed that a memory cell MCB is a memory cell which is programmed to have one of four states and that it is connected with an ith word line WLi+1. An (i+1)th word line WLi+1 is a word line topside adjacent to the ith word line WLi. It is assumed that a memory cell (e.g., MCA) connected with the ith word line WLi is programmed firstly and then a memory cell (e.g., MCB) connected with the (i+1)th word line WLi+1 is programmed.

When the memory cell MCB is programmed, charge is accumulated on its floating gate and its threshold voltage becomes high. At this time, a potential of a floating gate of a previously programmed memory cell may become high due to the coupling with the floating gate of the memory cell MCB. The increased potential of the floating gate of the memory cell MCA continues to be maintained due to the coupling between adjacent floating gates after programming of the memory cell MCB is completed. At this time, the coupling forced to the memory cell MCA results from all adjacent memory cells placed in a word line/bit line direction. This coupling makes a threshold voltage of a programmed memory cell MCA become high. This means that a threshold voltage distribution of the memory cell MCA is widened as illustrated in dotted lines 42_1 to 42_4, 43_1 to 43_4, and 44_1 to 44_4. As a threshold voltage distribution of each data state is widened due to the coupling effect, the margin between adjacent data states is reduced as marked by W2, W3, and W4. Reduction of the margin between adjacent data states increases such a probability that a reading result is erroneous.

The larger a variation in a program state of the adjacent memory cell MCB, the larger a variation in a threshold voltage of the memory cell MCA due to the coupling. For example, the solid lines 41_1 to 41_4 of FIG. 2 indicate threshold voltage distributions of the memory cells MCA when the adjacent memory cell MCB is programmed to a data state of "E" corresponding to an LSB threshold voltage distribution. That is, if the adjacent memory cell MCB is programmed to a data state of "E", the coupling is hardly generated. The dotted lines 42_1 to 42 4 indicate threshold voltage distributions of the memory cell MCA when the adjacent memory cell MCA is programmed to a data state of "P1". In the case that the adjacent memory cell MCA is programmed to a data state of "P1", the coupling effect is increased as compared when the adjacent memory cell MCB is programmed to the data state of "E".

The dotted lines 43_1 to 43_4 indicate threshold voltage distributions of the memory cell MCA when the adjacent memory cell MCB is programmed to a data state of "P2". In the case that the adjacent memory cell MCA is programmed to a data state of "P2", the coupling effect is increased as compared when the adjacent memory cell MCB is programmed to the data state of "P1". The dotted lines 44_1 to 44_4 indicate threshold voltage distributions of the memory cell MCA when the adjacent memory cell MCB is programmed to a data state of "P3". In the case that the adjacent memory cell MCA is programmed to a data state of "P3", the coupling effect is increased as compared when the adjacent memory cell MCB is programmed to the data state of "P2".

In example embodiments, the coupling effect between adjacent memory cells is compensated by performing a reading operation with respect to a memory cell connected with a selected word line (e.g., WLi) with reference to program states (or, programmed data values) of memory cells connected with an adjacent word line (e.g., WLi+1). In case of the reading operation according to example embodiments, there is determined a coupling compensation parameter (e.g., a sensing time, a pre-charge voltage level, etc.) according to program states of memory cells (i.e., adjacent memory cells) connected with the adjacent word line (e.g., WLi+1). Program states of adjacent memory cells are closely related to the effect of the coupling caused by adjacent memory cells. A value of the coupling compensation parameter is adjusted differently according to program states of adjacent memory cells. Thus, the effect of the coupling caused between adjacent memory cells is effectively compensated at a reading operation, and accurate reading is made.

Figure 4:
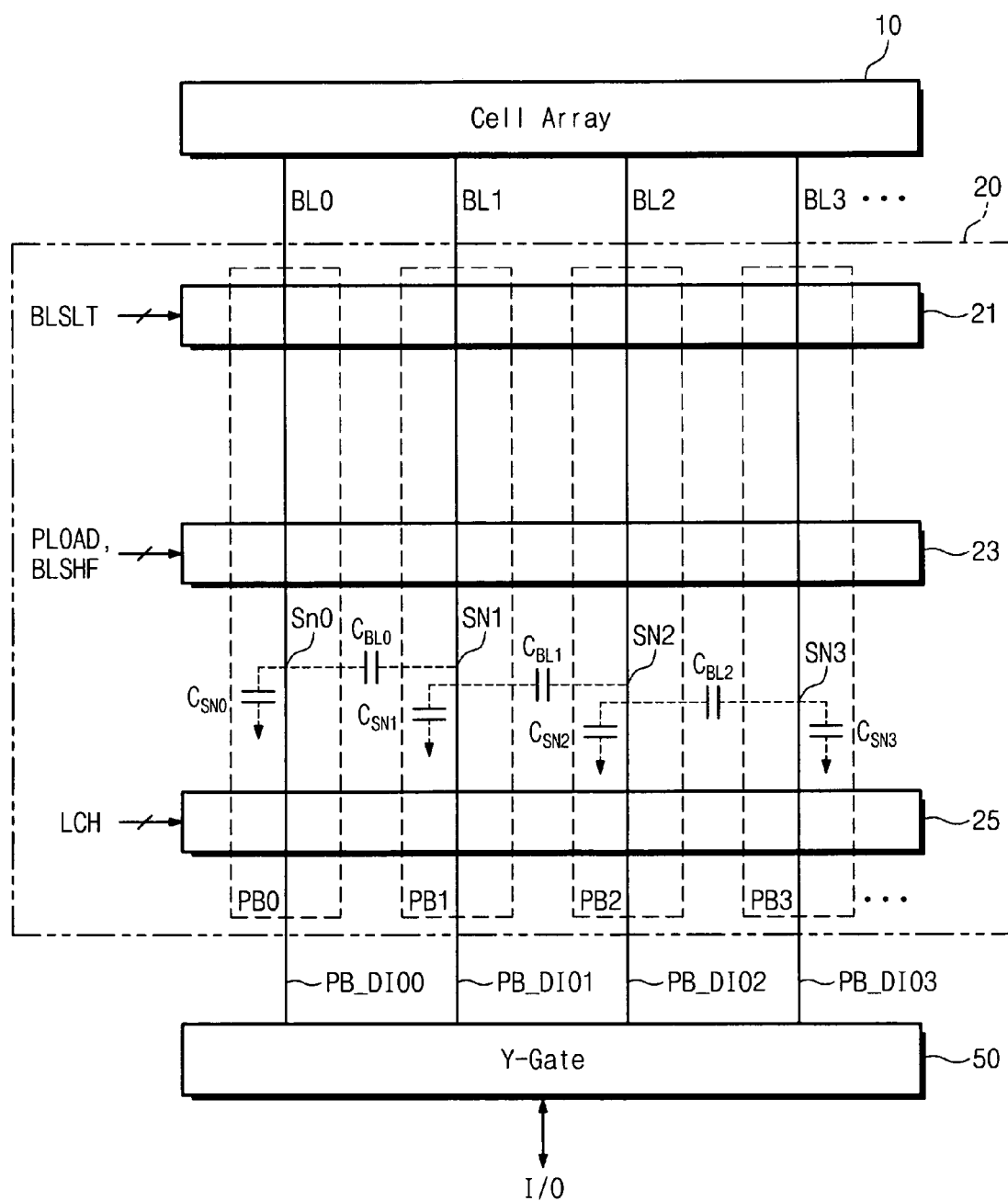
FIG. 4 is a diagram showing schematic configuration of a page buffer circuit according to an example embodiment.

FIG. 4 shows a schematic configuration of a page buffer circuit according to example embodiments.

Referring to FIG. 4, a page buffer circuit 20 includes a plurality of, for example, four page buffers PB10 to PB3. The page buffers PB0 to PB3 are configured identically to one another. The page buffers PB0 to PB3 are electrically connected with corresponding bit lines BL0 to BL3, respectively. The input/output of data PB_DIO0 to PB_DIO3 for the page buffers PB0 to PB3 is made via a column gate circuit 50. FIG. 4 shows an example configuration where the page buffers PB0 to PB3 are allotted to respective bit lines BL0 to BL3. For example, the page buffers PB0 to PB3 are connected in a one-to-one manner with bit lines without sharing with at least two or more bit lines. An interconnection between the page buffers PB0 to PB3 and bit lines is able to be changed variously. The configuration of the respective page buffers PB0 to PB3 is as follows.

Each of the page buffers PB0 to PB3 includes a bit line select and bias circuit 21, a pre-charge circuit 23, and a sense and latch circuit 25. Sensing nodes SN0 to SN3 for sensing data states programmed to corresponding memory cells are provided between the pre-charge circuits 23 and the sense and latch circuits 25, respectively.

The bit line select circuit 21 performs a function of selecting a bit line, for which data sensing is to be made, in response to a bit line select signal BLSLT. The pre-charge circuit 23 pre-charges a selected bit line and a sensing node in response to pre-charge control signals PLOAD and BLSHF. The pre-charge operation is made before a sensing operation is carried out for a memory cell connected with a selected bit line. After the selected bit line is pre-charged, a voltage of the selected bit line is varied during a sensing period according to a data value programmed in a selected memory cell. After a sensing period elapses, the sense and latch circuit 25 senses a voltage of the sensing node SN0 in response to a latch control signal LCH and stores the sensed result as a reading result in a latch. The control signals BLSLT, PLOAD, BLSHF, and LCH for controlling operations of the page buffers PB0 to PB3 may be generated from control logic (not shown) in the flash memory device 100.

As illustrated in FIG. 4, capacitance elements $C_{SN0}$ to $C_{SN3}$ exist at the sensing nodes SN0 to SN3 of the page buffers PB0 to PB3, respectively, and capacitance elements $C_{BL0}$ to $C_{BL2}$ exist between adjacent sensing nodes SN0 to SN3, respectively. The capacitance elements $C_{SN0}$ to $C_{SN3}$ and $C_{BL0}$ to $C_{BL2}$ in the page buffers PB0 to PB3 have the close relationship with voltage levels of the sensing nodes SN0 to SN3 and the amount of current flowing to a selected memory cell. Accordingly, it is possible to adjust develop periods of time of the selected bit line and the sensing nodes SN0 to SN3 by controlling sizes of the capacitance elements $C_{SN0}$ to $C_{SN3}$ and $C_{BL0}$ to $C_{BL2}$ in the page buffers PB0 to PB3. The sizes of the capacitance elements $C_{SN0}$ to $C_{SN3}$ and $C_{BL0}$ to $C_{BL3}$ in the page buffers PB0 to PB3 may be adjusted at designing of the page buffer circuit 20.

But, the capacitance elements $C_{BL0}$ to $C_{BL2}$ existing between adjacent sensing nodes SN0 to SN3 are a type of a parasitic capacitance element. Thus, controlling of the sizes of the capacitance elements $C_{BL0}$ to $C_{BL2}$ is not easy. On the other hand, the capacitance elements $C_{SN0}$ to $C_{SN3}$ are able to be controlled quantitatively at designing of the page buffer circuit 20. Thus, in accordance with the page buffers PB0 to PB3 of example embodiments, sizes of the capacitance elements $C_{SN0}$ to $C_{SN3}$ are set up such that a sensing operation is carried out directly after a pre-charge operation without a develop period. That is, a reading operation of the page buffers PB0 to PB3 is formed of a pre-charge period and a sensing period. With the above-described configuration of the page buffer PB0 to PB3, a reading operation is carried out fast since no develop period is needed. Therefore, the reading method according to example embodiments is suitable for a reading operation of a multi-level cell which needs repetitive reading. There is used a page buffer having a fast sensing characteristic which does not need a separate develop period.

Each of the page buffers PB0 to PB3 may include a plurality of, for example, 3 or more latches, which may be implemented in the sense and latch circuit 25 of the page buffers PB0 to PB3. Among a plurality of latches in each of the page buffers PB0 to PB3, at least one latch (e.g., one or two latches) may be used to store a data value read out from an adjacent memory cell (e.g., an adjacent memory cell connected with a word line WLi+1). The remaining latch or latches may be used to store a data value read out from a selected memory cell (e.g., a memory cell connected with a selected word line WLi). Data of the adjacent memory cell stored in the page buffers PB0 to PB3 may be used to adjust a point of time when a data value read out from a selected memory cell is latched, or a level of a bit line pre-charge voltage of the selected memory cell. As a result, there is compensated the effect of the coupling forced to each memory cell according to a data state of an adjacent memory cell.

It is apprehended that the above-described circuits 21, 23, and 25 are modified or varied variously within the scope of example embodiments. Accordingly, configurations of the circuits 21, 23, and 25 are not limited to the specific structures illustrated in FIG. 4. Further, sizes and setting of the capacitance elements $C_{SN0}$ to $C_{SN3}$ of the page buffers PB0 to PB3 are not limited to this disclosure.

Figure 5:
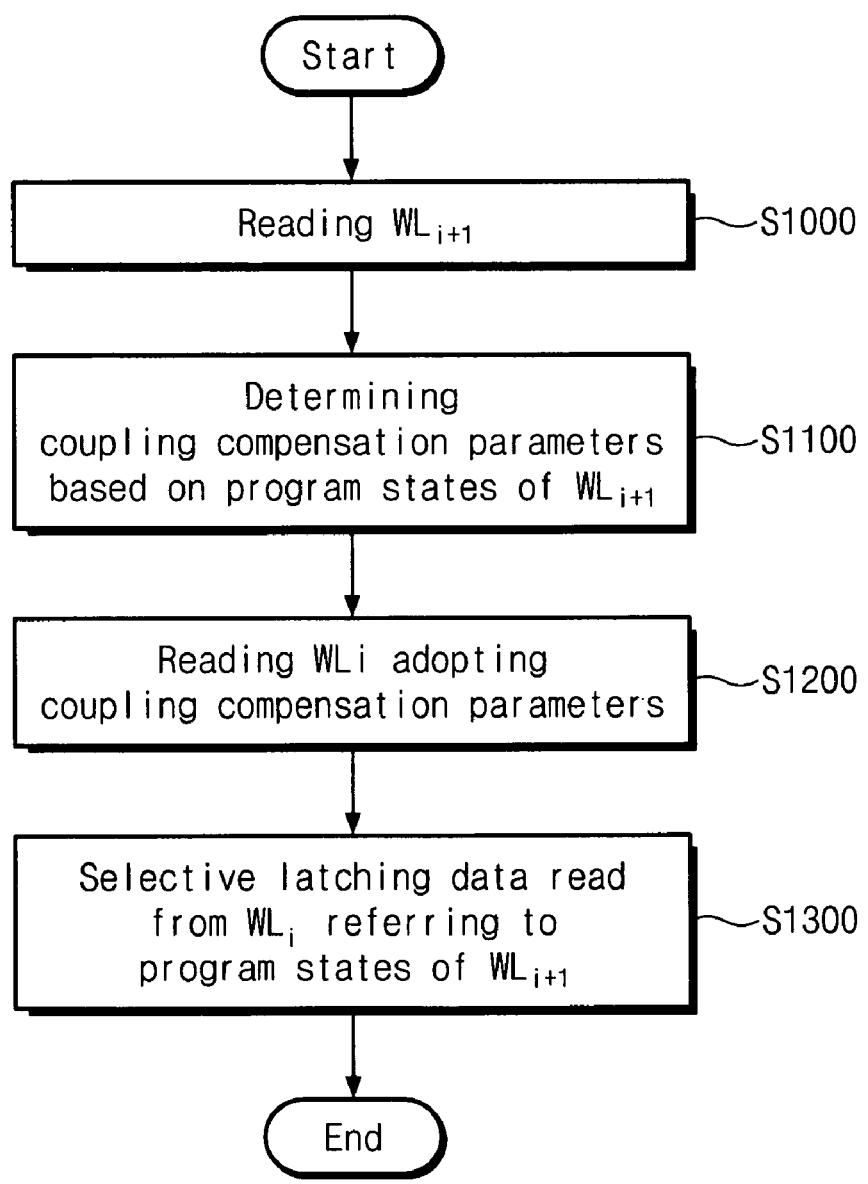
FIG. 5 is a flow chart showing a reading method of a flash memory device according to one example embodiment.

FIG. 5 is a flowchart showing a reading method of a flash memory device according to example embodiments.

Referring to FIG. 5, in step S1000, data is read out from adjacent memory cells MCBi connected with an adjacent word line WLi+1 of selected memory cells MCAi. There is judged programmed data states of the adjacent memory cells MCBi connected with the adjacent word line WLi+1 based upon the read data. In step S1100, there is determined a coupling compensation parameter (e.g., a sensing time, a level of a bit line pre-charge voltage, etc.) on the basis of the judged data states of the adjacent memory cells MCBi. The coupling compensation parameter is able to be obtained from predetermined parameters instead of being determining whenever a reading operation is carried out. The coupling compensation parameter value is capable of being defined according to data values stored in the adjacent memory cells MCBi.

In step S1200, data is read with the determined coupling compensation parameter being applied to each memory cell MCAi connected with the selected word line WLi. A reading operation for the selected memory cells MCAi carried out in step S1200 may be carried out once or more with respect to memory cells connected with the selected word line WLi. A reading operation may be applied with different coupling compensation parameters based upon program states of the adjacent memory cells MCBi. The different coupling compensation parameters are capable of being applied to a pre-charge period or a sensing period included in each of reading operations for the selected word line WLi. The coupling compensation parameter is used to compensate the effect of the coupling caused at programming of an adjacent memory cell at a read operation.

In step S1300, data read from the selected memory cells MCAi is selectively latched from respective bit lines according to program states of the adjacent memory cells MCBi. That is, a reading operation for each memory cell is carried out once or more, while data read from each memory cell is stored via one latch operation.

The reading method described in FIG. 5 needs a software operation which is used to determine timing for latching a data value of a selected memory cell MCAi on the basis of a program state of an adjacent memory cell MCBi. If a sensing time allotted for a reading operation is not sufficient to perform a software operation, the reading method according to example embodiments may perform a reading operation via the following repetitive sensing scheme.

Figure 6:
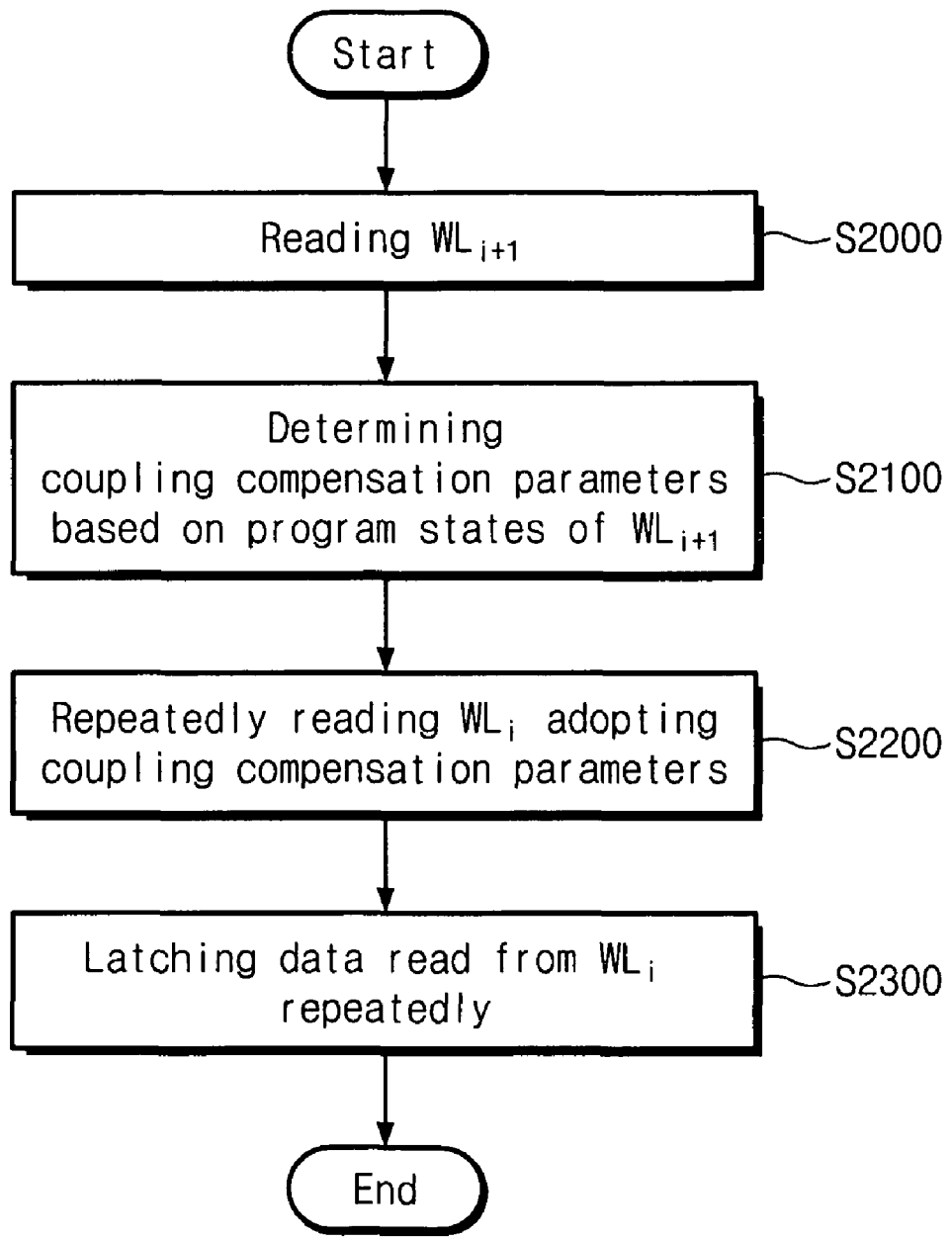
FIG. 6 is a flow chart showing a reading method of a flash memory device according to another example embodiment.

FIG. 6 is a flowchart showing a reading method of a flash memory device according to another example embodiment.

Referring to FIG. 6, in step S2000, data is read out from adjacent memory cells MCBi connected with an adjacent word line WLi+1 of selected memory cells MCAi. There is judged program states of the adjacent memory cells MCBi connected with the adjacent word line WLi+1 based on the read data. In step S2100, there is determined a coupling compensation parameter (e.g., a sensing time, a level of a bit line pre-charge voltage, etc.) based on the judged program states of the adjacent memory cells MCBi. The coupling compensation parameter is able to be obtained from predetermined parameters instead of being determining whenever a reading operation is carried out. The coupling compensation parameter value is capable of being defined according to data values stored in the adjacent memory cells MCBi.

In step S2200, data is repetitively read from the memory cells MCAi connected with the selected word line WLi with the determined coupling compensation parameter being applied. In step S2300, there is latched data read via the repetitive reading operations.

Different coupling compensation parameters are able to be applied to the repetitive reading operations in step S2200, respectively. The different coupling compensation parameters are able to be applied to a pre-charge period or a sensing period of a reading operation for memory cells MCAi connected with a selected word line WLi. The coupling compensation parameter is used to compensate the effect of the coupling caused at programming of an adjacent memory cell at a reading operation. The number of reading operations repeated in step S2200 is defined according to the number of data states which are capable of being stored in each memory cell.

If each memory cell is programmed to one of four data states, four reading operations are made with respect to all of selected memory cells MCAi. At this time, different coupling compensation parameters are applied to four reading operations, respectively. Data read via four reading operations in step S2200 may be latched via four latch operations in step S2300. In this case, four reading operations and four latch operations are performed with respect to each memory cell MCAi connected with the selected word line WLi. In accordance with the reading method described in FIG. 6, it is possible to perform an accurate reading operation by applying a repetitive sensing scheme when a sensing time allotted to a reading operation is short.

In accordance with the reading method described in FIG. 6, a reading operation and a latch operation for a memory cell MCAi are repeated considering all data values of adjacent memory cells MCBi. Accordingly, it is not necessary to determine whether or not of latching considering a data value of an adjacent memory cell MCBi during a short sensing period which is allotted for a reading operation. Thus, although a sensing time allotted for a reading operation is not sufficient to perform a software operation for determining whether or not of latching, accurate reading is made via compensating for the effect of the coupling by adjacent memory cells.

A reading operation for selected memory cells MCAi carried out in steps S1200 and S2200 of FIGS. 5 and 6 is divided into the first and second embodiments. The first embodiment is a method for adjusting the length of a sensing period according to program states of adjacent memory cells MCBi, which will be more fully described with reference to FIGS. 7 and 11. The second embodiment is a method for adjusting a level of a bit line pre-charge voltage applied to bit lines during a pre-charge period according to program states of adjacent memory cells MCBi, which will be more fully described with reference to FIGS. 12 and 17.

FIGS. 7 to 11 are diagrams for describing a reading method for compensating the coupling effect by adjacent memory cells MCBi by adjusting the length of a sensing period according to program states of the adjacent memory cells MCBi.

Figure 7:
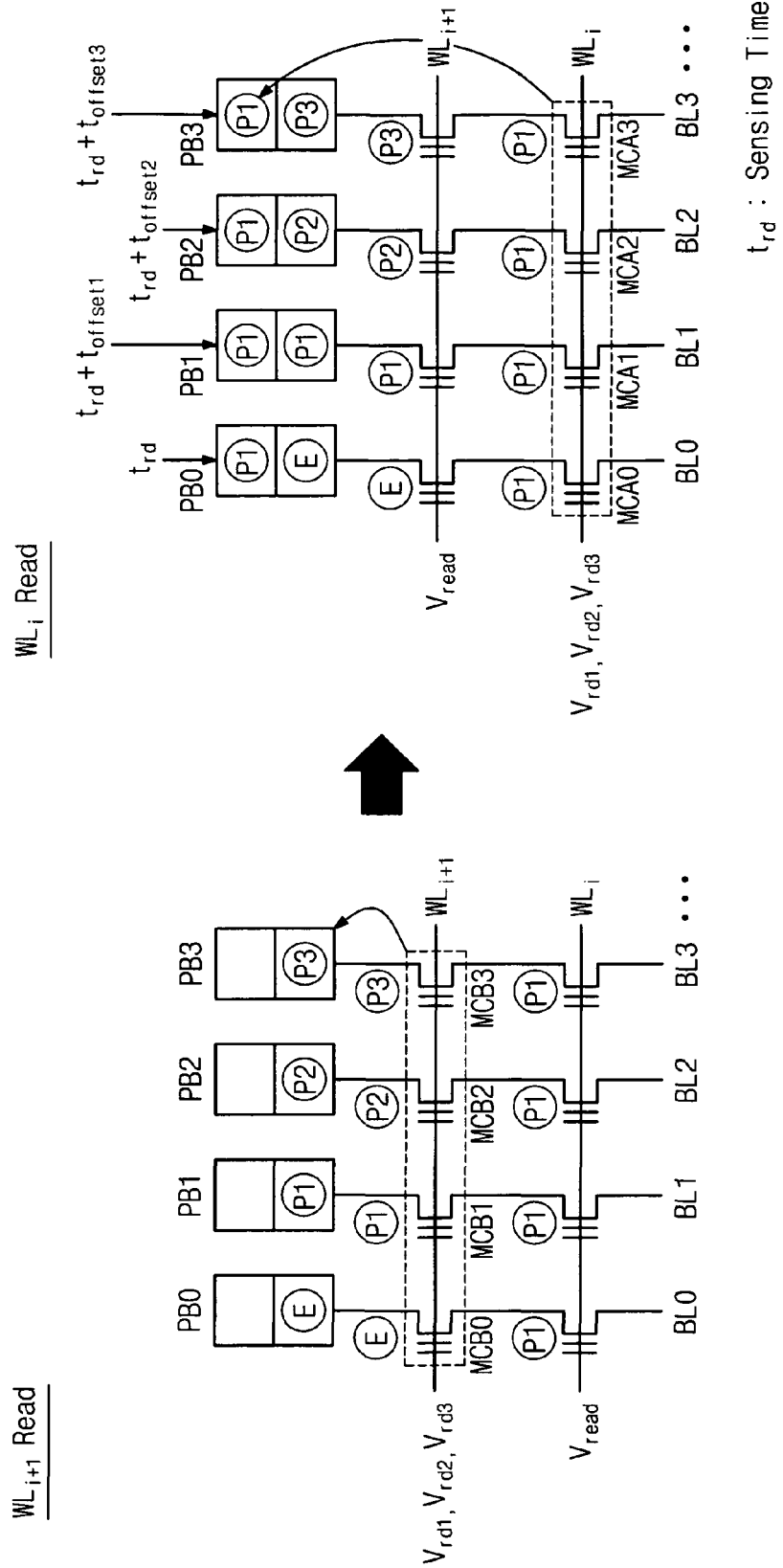
FIGS. 7 to 11 are diagrams for describing a reading method by adjusting the length of a sensing interval according to program states of adjacent memory cells.

Referring to FIG. 7, in the case that data is read out from a plurality of memory cells MCA0 to MCA3 (e.g., memory cells corresponding to one page) connected with a selected word line WLi, firstly, a reading operation is made with respect to a plurality of adjacent memory cells MCB0 to MCB3 (e.g., memory cells corresponding to one page) connected with a word line WLi+1 adjacent to the selected memory cells MCA0 to MCA3. Data values read from the plurality of adjacent memory cells MCB0 to MCB3 may be stored in at least one or more latches in corresponding page buffers PB0 to PB3, respectively.

FIG. 7 shows an example that the adjacent memory cell MCB0 connected with the first bit line BL0 is programmed to a data state of "E" and the adjacent memory cell MCB1 connected with the second bit line BL1 is programmed to a data state of "P1". Further, in the example, the adjacent memory cell MCB2 connected with the third bit line BL2 is programmed to a data state of "P2" and the adjacent memory cell MCB3 connected with the fourth bit line BL3 is programmed to a data state of "P3". Threshold voltage distributions of memory cells corresponding to data states of "E" to "P3" are illustrated in FIG. 2.

Referring to FIGS. 2 and 7, in a case where the adjacent memory cell MCB0 is programmed to a data state of "E" and the selected memory cell MCA0 is programmed in a data state of "P1", the selected memory cell MCA0 does not suffer from the coupling effect from the adjacent memory cell MCB0. In this case, a threshold voltage distribution of the selected memory cell MCA0 may correspond to a state marked by 41_2 in FIG. 2. At this time, data programmed in the selected memory cell MCA0 may be sensed and latched during the first sensing time $t_{rd}$. This reading characteristic may be applied without locations of bit lines if a program state of an adjacent memory cell MCBi of a plurality of memory cells (e.g., memory cells corresponding to one or more pages) connected with the same word line WLi as the selected memory cell MCA0 is a state of "E".

If the adjacent memory cell MCB1 is programmed to a data state of "P1" and the selected memory cell MCA1 is programmed to a data state of "P1", a threshold voltage distribution of the memory cell MCA1 is varied from 41_2 to 42_2 due to the coupling effect suffering from the adjacent memory cell MCB1. At this time, data programmed in the selected memory cell MCA1 may be sensed and latched during the second sensing time $t_{rd}+t_{offset1}$ to compensate the coupling effect. This reading characteristic may be applied without locations of bit lines if a program state of an adjacent memory cell MCBi of a plurality of memory cells (e.g., memory cells corresponding to one or more pages) connected with the same word line WLi as the selected memory cell MCA1 is a state of "P1".

If the adjacent memory cell MCB2 is programmed to a data state of "P2" and the selected memory cell MCA2 is programmed to a data state of "P1", a threshold voltage distribution of the memory cell MCA2 is varied from 41_2 to 43_2 due to the coupling effect suffering from the adjacent memory cell MCB2. At this time, data programmed in the selected memory cell MCA2 may be sensed and latched during the third sensing time $t_{rd}+t_{offset2}$ to compensate the coupling effect. This reading characteristic may be applied without locations of bit lines if a program state of an adjacent memory cell MCBi of a plurality of memory cells (e.g., memory cells corresponding to one or more pages) connected with the same word line WLi as the selected memory cell MCA2 is a state of "P2".

If the adjacent memory cell MCB3 is programmed to a data state of "P3" and the selected memory cell MCA3 is programmed to a data state of "P1", a threshold voltage distribution of the memory cell MCA3 is varied from 41_2 to 44_2 due to the coupling effect suffering from the adjacent memory cell MCB3. At this time, data programmed in the selected memory cell MCA3 may be sensed and latched during the fourth sensing time $t_{rd}+t_{offset3}$ to compensate the coupling effect. This reading characteristic may be applied without locations of bit lines if a program state of an adjacent memory cell MCBi of a plurality of memory cells (e.g., memory cells corresponding to one or more pages) connected with the same word line WLi as the selected memory cell MCA3 is a state of "P3".

Figure 8:
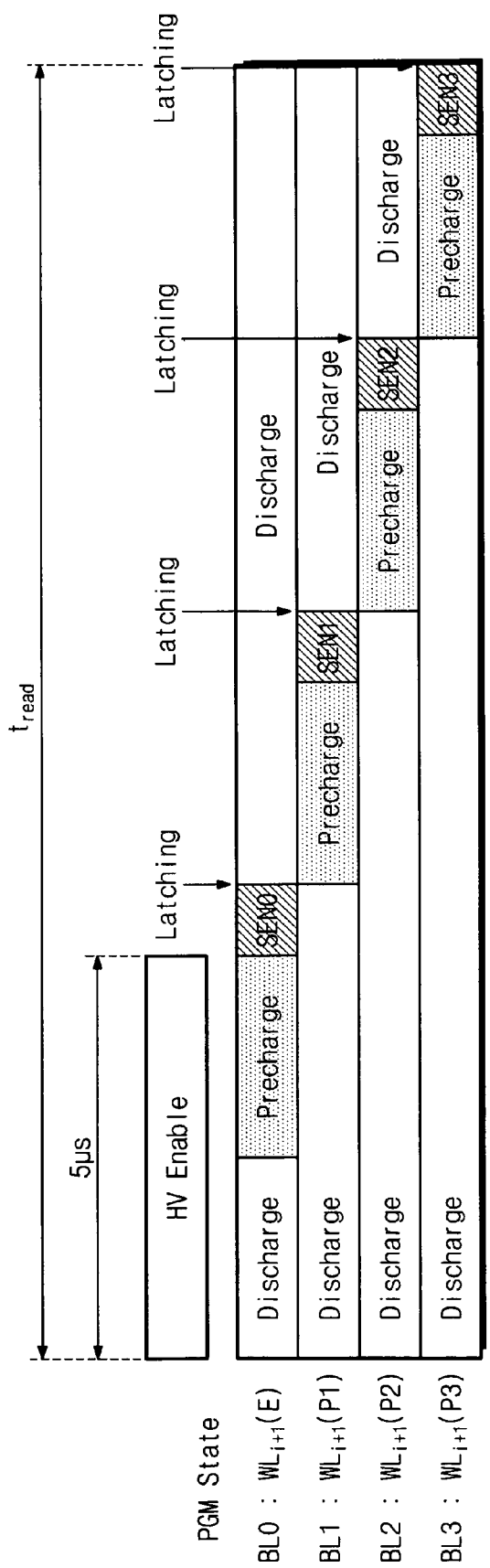
Figure 9:
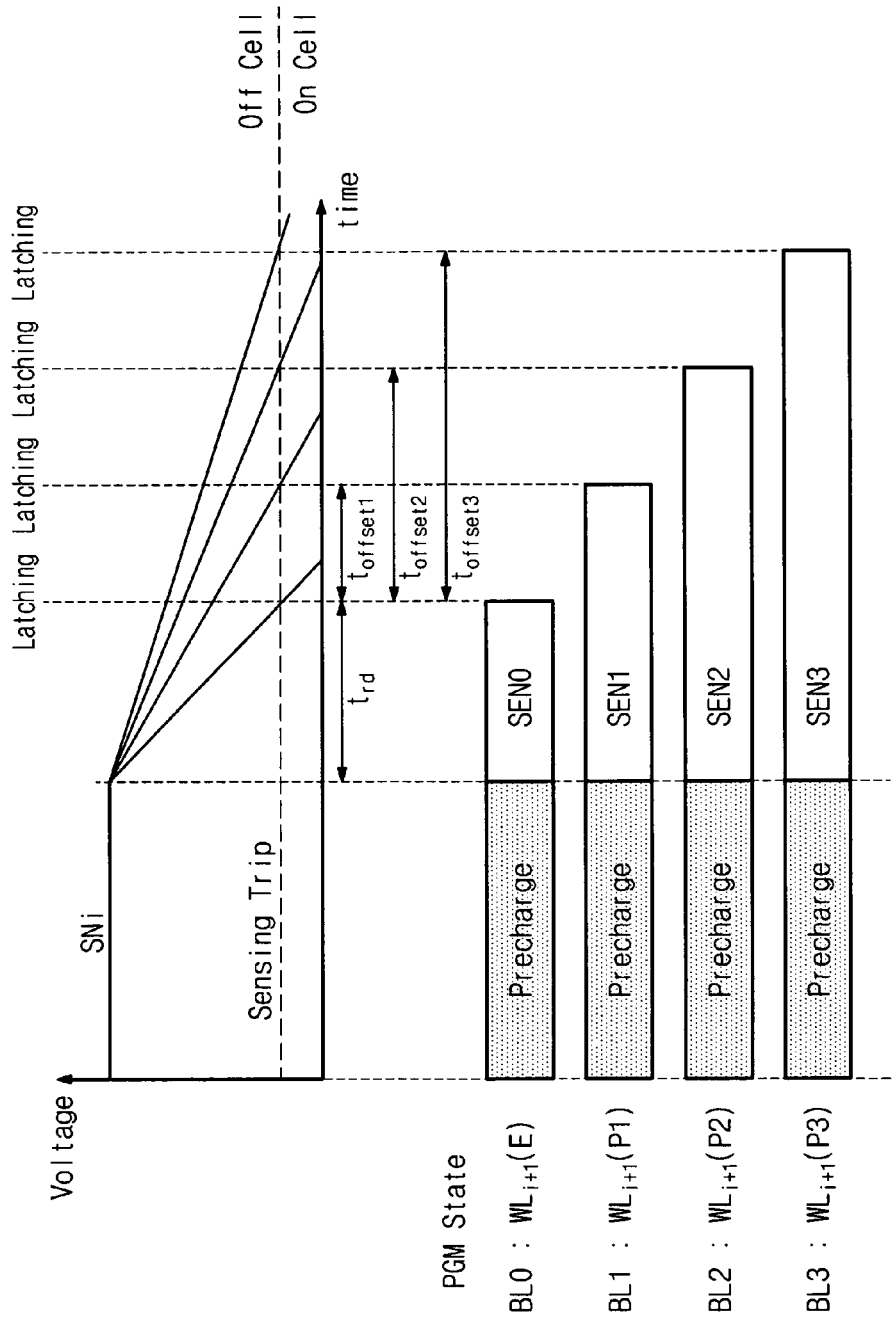

FIGS. 8 and 9 show an example read method where one pre-charge operation and one sensing operation are made at each bit line.

Referring to FIGS. 8 and 9, one pre-charge operation and one sensing operation are performed with respect to each of a plurality of selected memory cells (e.g., memory cells corresponding to one page) which are connected with a word line WLi. In the case that each memory cell is programmed to have one of four threshold voltage distributions E, P1, P2, and P3, data programmed in each memory cell is sensed and latched within one of four sensing periods SEN0 to SEN3 according to a program state of an adjacent memory cell. Whether a sensing operation of any period among the four sensing periods SEN0 to SEN3 is carried out at each bit line, is determined differently according to a data value of an adjacent memory cell. The sensing periods SEN0 to SEN3 may have different sensing times from one another. The changed sensing times make it to be compensated the effect of coupling varied according to a program state of an adjacent memory cell. The more the number of data bits stored in each cell is increased, the more various kinds of practicable sensing times are increased.

If a page of memory cells is selected from a word line WLi for a read operation, during the first sensing period SEN0, there is sensed data of a memory cell MCAi, which is adjacent to a memory cell being a state "E", among the selected memory cell. For example, during the first sensing period SEN0, no sensing operation is made with respect to a memory cell which is adjacent to a memory cell MCBi being programmed to a state "P1", "P2", or "P3". The first sensing time $t_{rd}$ is applied to the first sensing period SEN0. A pre-charged voltage level of a bit line of a memory cell MCAi is dropped up to a level of a predetermined sensing trip voltage during the first sensing time $t_{rd}$. If a voltage of a sensing node is lowered below the sensing trip voltage, a corresponding memory cell is judged to be an 'ON cell'. If a voltage of a sensing node is not lowered below the sensing trip voltage, a corresponding memory cell is judged to be an 'OFF cell'. Data sensed within the first sensing period SEN0 is stored in a latch of a corresponding page buffer.

Data of a memory cell MCAi, which is adjacent to a memory cell MCBi of a 'P1' state, among memory cells in the selected page, is sensed during the second sensing period SEN1. The second sensing time $(t_{rd}+t_{offset1})$ is applied to the second sensing period SEN1. A voltage level of a bit line of a memory cell MCAi, which is pre-charged, is dropped to a predetermined sensing trip voltage level during the second sensing time $(t_{rd}+t_{offset1})$. The second sensing time $(t_{rd}+t_{offset1})$ has a sensing time longer by an offset period $t_{offset1}$ than the first sensing time $t_{rd}$. The increased sensing time enables the coupling effect due to an adjacent memory cell MCBi to be compensated. Sensed data is stored in a latch of a corresponding page buffer.

If the first sensing time $t_{offset1}$ is applied to the second sensing period SEN1 instead of the second sensing time $(t_{rd}+t_{offset1})$, a voltage level of a bit line is not dropped up to a predetermined sensing trip voltage level during a sensing period because of the coupling effect of the adjacent memory cell MCBi. If a voltage level of a bit line is not dropped up to a predetermined sensing trip voltage level, a threshold voltage of a selected memory cell is recognized as though it is increased (i.e., as if current flows to a selected memory cell). In example embodiments, compensation of the coupling effect is made by adjusting the length of a sensing time according to a data value of an adjacent memory cell MCBi. As the sensing time is adjusted, a voltage level of a bit line of a selected memory cell is dropped to a predetermined sensing trip voltage level and current decrement due to the coupling effect is compensated. Additional circuit elements are not needed to adjust the sensing time as described above.

Data of a memory cell MCAi, which is adjacent to a memory cell MCBi of a P2' state, among memory cells in the selected page, Is sensed during the third sensing period SEN2. The third sensing time $(t_{rd}+t_{offset2})$ is applied to the third sensing period SEN2. A voltage level of a bit line of a memory cell MCAi, which is pre-charged, is dropped to a predetermined sensing trip voltage level during the third sensing time $(t_{rd}+t_{offset2})$. The third sensing time $(t_{rd}+t_{offset2})$ has a sensing time longer than the second sensing time $(t_{rd}+t_{offset1})$. The increased sensing time enables the coupling effect due to an adjacent memory cell MCBi to be compensated. Sensed data is stored in a latch of a corresponding page buffer.

During the fourth sensing period SEN3, there is sensed data of a memory cell MCAi, which is adjacent to a memory cell MCBi of a 'P3' state, among memory cells in the selected page. The fourth sensing time $(t_{rd}+t_{offset3})$ is applied to the fourth sensing period SEN3. A voltage level of a bit line of a memory cell MCAi, which is pre-charged, is dropped to a predetermined sensing trip voltage level during the fourth sensing time $(t_{rd}+t_{offset3})$. The fourth sensing time $(t_{rd}+t_{offset3})$ has a sensing time longer than the third sensing time $(t_{rd}+t_{offset2})$. The increased sensing time enables the coupling effect due to an adjacent memory cell MCBi to be compensated. Sensed data is stored in a latch of a corresponding page buffer.

As described above, the coupling effect is compensated by adjusting a sensing time of a selected memory cell MCAi based on a program state of an adjacent memory cell MCBi. This is because a page buffer circuit 20 has a rapid sensing characteristic which does not need a develop period.

In the case that the page buffer circuit 20 has a rapid sensing characteristic, during a sensing period, a voltage of a sensing node SNi changes sharply. Sharp voltage variation made at the sensing node SNi during a sensing period can much effect a sensing result even at a little time variation. Accordingly, if a length of a sensing period is adjusted (i.e., a data latching point of time is adjusted), there is changed a sensing trip point where an ON/OFF state of a selected memory cell MCAi is sensed. Changing of the trip point results in the effect such as compensating of the coupling caused by a just adjacent memory cell MCBi to a selected memory cell MCAi. The offset values $t_{offset1}$ to $t_{offset3}$ used to adjust the length of a sensing period are used as coupling compensation parameters for compensating the coupling due to an adjacent memory cell MCBi.

Figure 10:
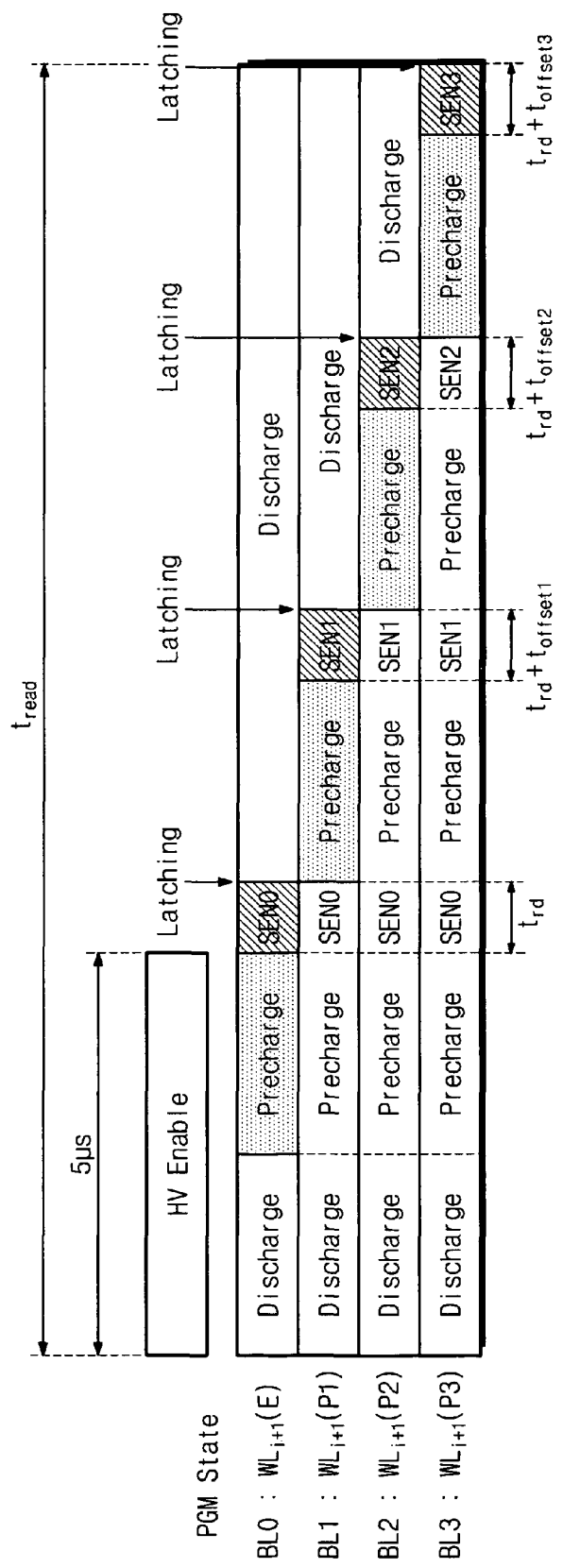

FIG. 10 shows an example read method where a plurality of sensing periods SEN0 to SEN3 are repeated with respect to a plurality of selected memory cells and a latch operation is selectively made according to a data value of an adjacent memory cell.

Referring to FIG. 10, four sensing periods SEN0 to SEN3 are sequentially carried out at different timing with respect to a selected memory cell. But, a latch operation is not carried out with respect to all memory cells, but selectively according to a data value of an adjacent memory cell.

For example, the first sensing period SEN0 is made with respect to all of selected memory cells (e.g., memory cells in one page). A latch operation is made selectively with respect to a memory cell which is adjacent to a memory cell having a 'E' state. It is possible to do a read operation such that further sensing and latch operations are not made with respect to memory cells to which the latch operation is carried out. In FIG. 10, sensing times each applied to sensing periods SEN0 to SEN3 are the same as those illustrated in FIG. 9.

Then, the second sensing period SEN1 is made with respect to all of the selected memory cells or with respect to memory cells, to which a latch operation has not yet been made, among the selected memory cells. During the second sensing period SEN1, a latch operation is performed selectively with respect to memory cells which are adjacent to a memory cell having a data value corresponding to 'P1'. Successively, the third and fourth sensing periods SEN2 and SEN3 are sequentially made with respect to all of the selected memory cells or with respect to memory cells, to which a latch operation has not yet been made, among the selected memory cells. During the third sensing period SEN2, a latch operation is performed selectively with respect to memory cells, which are adjacent to a memory cell having a data value corresponding to 'P2', among selected memory cells (e.g., memory cells in one page). During the fourth sensing period SEN3, a latch operation is performed selectively with respect to memory cells, which are adjacent to a memory cell having a data value corresponding to 'P3', among selected memory cells (e.g., memory cells in one page).

The read methods described in FIGS. 8 to 10 correspond to the case that a sensing time as a coupling compensation parameter is applied to a read method described in FIG. 5. This method may be performed using, for example, a software operation for determining the data latch timing of a selected memory cell MCAi based on a program state of an adjacent memory cell MCBi. If a sensing time allotted to a read operation is not sufficient to perform a software operation, there is made a read operation to which the following repetitive sensing scheme is applied.

Figure 11:
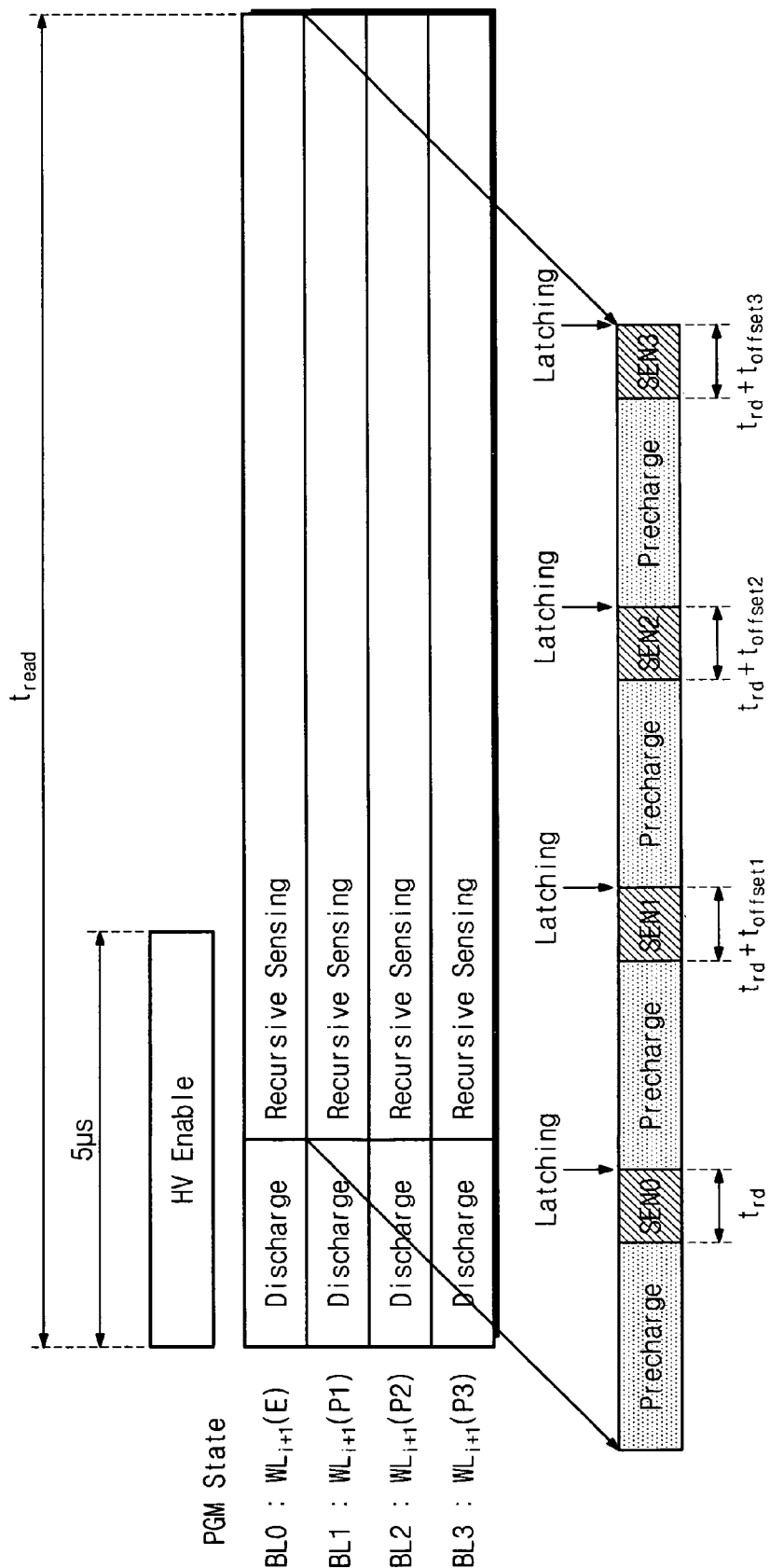

FIG. 11 shows an example read method in which a sensing time is adjusted according to a data value stored in an adjacent memory cell and the coupling effect from an adjacent memory cell is compensated via a repetitive sensing operation. A read method in FIG. 11 corresponds to the case that a sensing time as a coupling compensation parameter is applied to a read method described in FIG. 6.

Referring to FIG. 11, in case of a read method according to an example embodiment, a pre-charge operation and a sensing operation are made repetitively by a predetermined number with respect to a plurality of memory cells which are connected to a selected word line WLi. For example, it is assumed that each memory cell is programmed to have one of four threshold voltage distributions E, P1, P2, and P3. Data programmed in each memory cell may be sensed repetitively within four sensing periods SEN0 to SEN3 having different sensing times from one another. In this case, timings of the pre-charge and sensing operations carried out at all bit lines connected with selected memory cells coincide with one another.

For example, a pre-charge period and the first sensing period SEN0 are made with respect to all of selected memory cells (e.g., memory cells in one page). Data sensing is made with respect to all of the selected memory cells during the first sensing period SEN0. The data sensed at the first sensing period SEN0 is latched at corresponding page buffers. Data sensing is sequentially made with respect to all of the selected memory cells during the second to fourth sensing periods SEN1 to SEN3. The data sensed at each of the second to fourth sensing periods SEN1 to SEN3 is latched at corresponding page buffers. In FIG. 11, sensing times each applied to the first to fourth sensing periods SEN0 to SEN3 are the same as those in FIG. 9. The more the number of data bits stored in each cell, the more the number of repeated pre-charge and sensing operations.

As described above, in case of a read method in FIG. 11, a sensing operation is repeated with respect to each of selected memory cells, with all cases of sensing times being applied. In this case, different sensing times are applied to data latched in respective page buffers. Therefore, the coupling effect from an adjacent memory cell can be compensated by selecting one of data latched in respective page buffers. In accordance with the above-described read method, it is unnecessary to previously determine the timing for latching a sensed result of a selected memory cell MCAi according to a data value of an adjacent memory cell MCBi. Accordingly, although a short sensing time is allotted to a read operation, it is possible to make accurate reading via compensating of the coupling effect.

FIGS. 12 to 17 show diagrams for describing a read method for compensating of the coupling effect due to adjacent memory cells MCBi by adjusting a level of a pre-charge voltage of a bit line according to program states of the adjacent memory cells MCBi.

Figure 12:
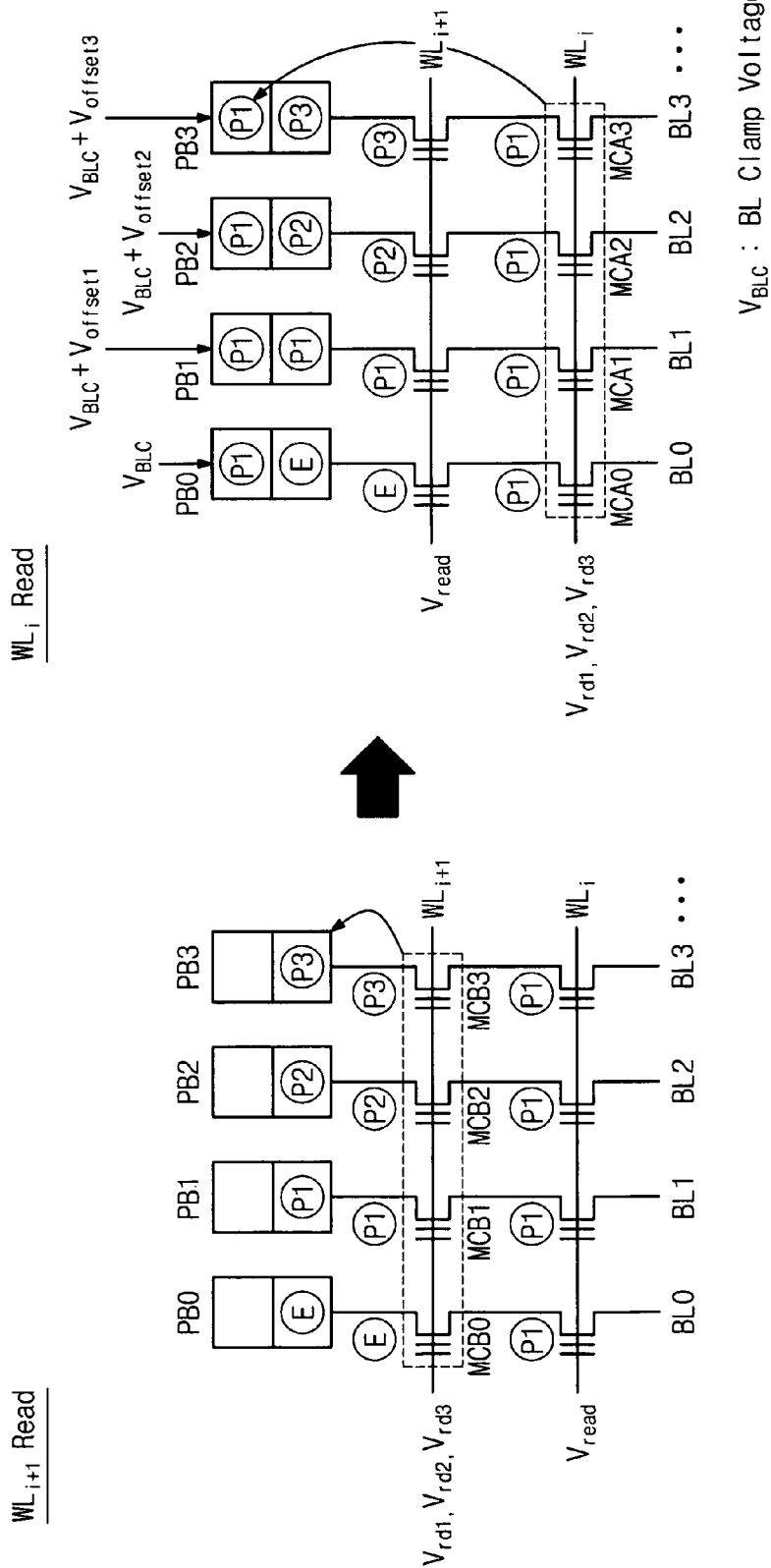
FIGS. 12 to 17 are diagrams for describing a reading method by adjusting a level of a pre-charge voltage of a bit line according to program states of adjacent memory cells.

Referring to FIG. 12, in case of reading data from memory cells MCA0 to MCA3 connected with a word line WLi, firstly, a read operation is made with respect to memory cells MCB0 to MCB3 (hereinafter, referred to as adjacent memory cells), which are connected with a word line WLi+1 (hereinafter, referred to as an adjacent word line), adjacent to the selected memory cells MCA0 to MCA3. Data values read out from the adjacent memory cells MCB0 to MCB3 may be stored in at least one or more latches in corresponding page buffers. After adjusting a level of a pre-charge voltage of a bit line based on the data states of the adjacent memory cells MCB0 to MCB3, a sensing operation for the selected memory cells MCA0 to MCA3 is made using the adjusted pre-charge voltage. Data values sensed from the selected memory cells MCA0 to MCA3 are stored in at least one or more latches of corresponding page buffers.

A read method illustrated in FIG. 12 is substantially identical to that in FIG. 7 except that a bit line pre-charge voltage is adjusted instead of a sensing time in order to compensate the coupling. Accordingly, constituent elements which have the same functions as those in FIG. 7 are marked by the same reference numerals, and description thereof is omitted. As will be more fully described below, a changed pre-charge voltage level conducts a role of compensating the coupling effect varied according to a program state of an adjacent memory cell.

As the number of data bits stored per cell increases, the number of pre-charge voltage levels applicable to a pre-charge operation increases. A sensing operation of memory cells according to an example embodiment is made considering a program state of an adjacent memory cell, which is as follows.

Figure 13:
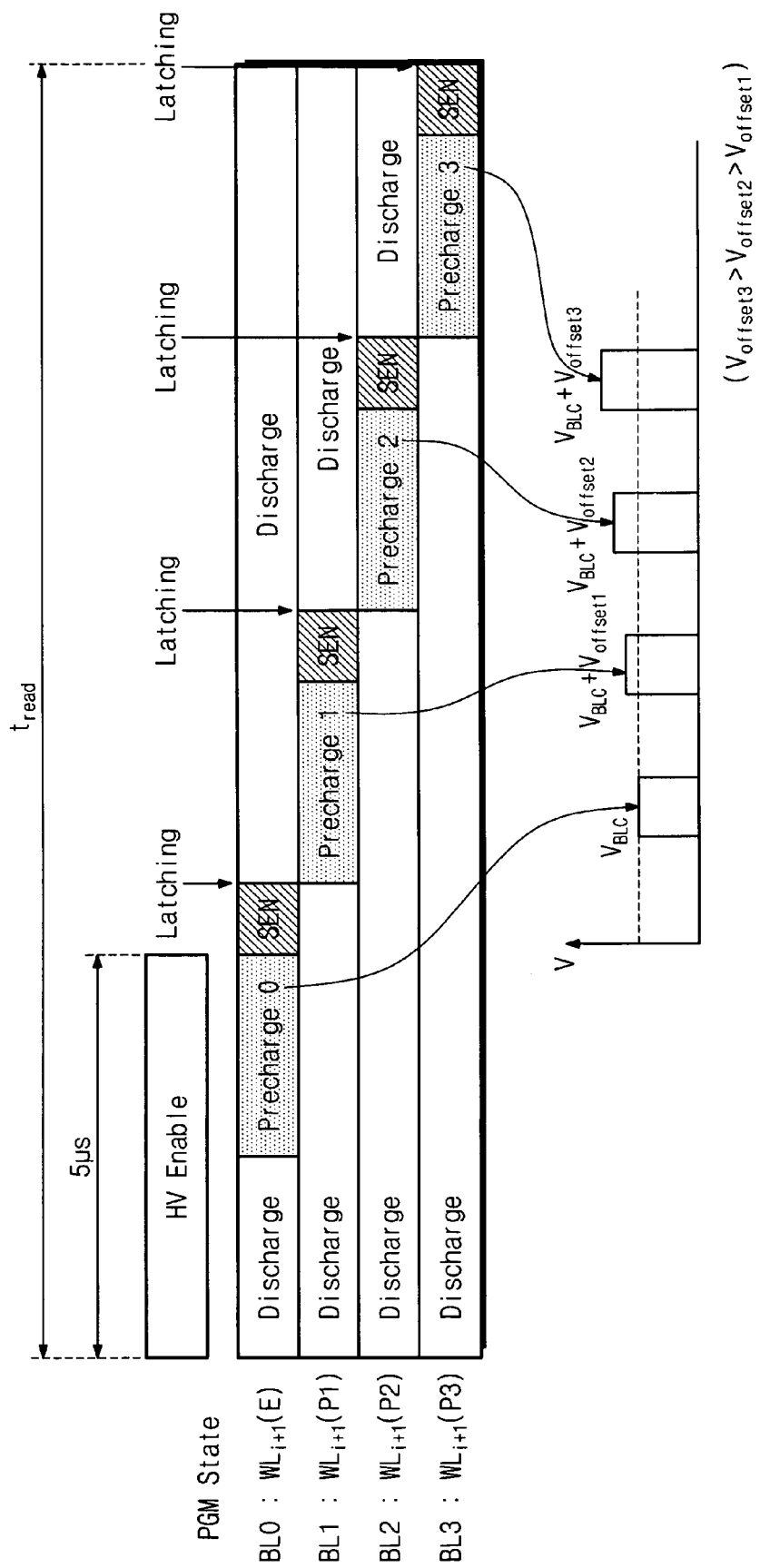

Referring to FIG. 13, one pre-charge operation and one sensing operation are made with respect to each of selected memory cells connected with a word line WLi. In the case that each memory cell is programmed to have one of four threshold voltage distributions E, P1, P2, and P3, a bit line connected with each memory cell may be pre-charged with one of four pre-charge voltages $V_{BLC}$, $V_{BLC}+V_{offset1}$, $V_{BLC}+V_{offset2}$, and $V_{BLC+Voffset3}$ according to a program state of an adjacent memory cell at a read operation.

In a case where there are selected memory cells, corresponding to one page, in a word line WLi at a read operation, during the first pre-charge period Precharge0, a bit line of a memory cell MCAi which is adjacent to a memory cell MCBi being a 'E' state is pre-charged with the first pre-charge voltage $V_{BLC}$. In this case, a bit line of a memory cell adjacent to a memory cell MCBi being programmed to one of 'P1' to 'P3' is not pre-charged during the first pre-charge period Precharge0. A voltage of a pre-charged bit line is discharged during a sensing period SEN, so that it drops to a predetermined sensing trip voltage level. A voltage of a bit line discharged during the sensing period SEN is sensed via a sensing node SNi, and the sensed result is stored in a latch of a corresponding page buffer.

During the second pre-charge period Precharge1, a bit line of a memory cell MCAi which is adjacent to a memory cell MCBi being a 'P1' state is pre-charged with the second pre-charge voltage $V_{BLC}+V_{offset1}$. In this case, a bit line of a memory cell adjacent to a memory cell MCBi having one of 'E', 'P2', and 'P3' is not pre-charged during the second pre-charge period Precharge1. A voltage of a pre-charged bit line is discharged during a sensing period SEN, so that it drops to a predetermined sensing trip voltage level. A voltage of a bit line discharged during the sensing period SEN is sensed via a sensing node SNi, and the sensed result is stored in a latch of a corresponding page buffer.

The second pre-charge $V_{BLC}+V_{offset1}$ voltage is higher than by an offset voltage $V_{offset1}$ than the first pre-charge voltage $V_{BLC}$. The increased pre-charge voltage enables the coupling effect due to an adjacent memory cell MCBi to be compensated.

If during the second pre-charge period Precharge1, a bit line is pre-charged with the first pre-charge voltage $V_{BLC}$ instead of the second pre-charge voltage $V_{BLC}+V_{offset1}$ a voltage level of a bit line does not reach a predetermined sensing trip voltage level during a sensing period because of the coupling effect due to an adjacent memory cell MCBi. If no voltage level of the bit line reaches the sensing trip voltage level, a selected memory cell may be recognized as if a less amount of current flows to the selected memory cell. To overcome this phenomenon, a level of a pre-charge voltage of a bit line is adjusted according to a data value of an adjacent memory cell MCBi. As the level of the bit line pre-charge voltage increases, it is recognized as if an amount of current flowing to a bit line is much. Accordingly, decrement of current due to the coupling is able to be compensated.

During the third pre-charge period Precharge2, a bit line of a memory cell MCAi which is adjacent to a memory cell MCBi being a 'P2' state is pre-charged with the third pre-charge voltage $V_{BLC}+V_{offset2}$. In this case, a bit line of a memory cell adjacent to a memory cell MCBi having one of 'E', 'P1', and 'P3' is not pre-charged during the third pre-charge period Precharge2. A voltage of a pre-charged bit line is discharged during a sensing period SEN, so that it drops to a predetermined sensing trip voltage level. A voltage of a bit line discharged during the sensing period SEN is sensed via a sensing node SNi, and the sensed result is stored in a latch of a corresponding page buffer.

During the fourth pre-charge period Precharge3, a bit line of a memory cell MCAi which is adjacent to a memory cell MCBi being a 'P3' state is pre-charged with the fourth pre-charge voltage $V_{BLC}+V_{offset2}$. In this case, a bit line of a memory cell adjacent to a memory cell MCBi having one of 'E', 'P1', and 'P2' is not pre-charged during the fourth pre-charge period Precharge3. A voltage of a pre-charged bit line is discharged during a sensing period SEN, so that it drops to a predetermined sensing trip voltage level. A voltage of a bit line discharged during the sensing period SEN is sensed via a sensing node SNi, and the sensed result is stored in a latch of a corresponding page buffer. In FIG. 12, sensing times each applied to sensing periods SEN are identical to one another.

As described above, the coupling effect is compensated by adjusting a level of a bit line pre-charge voltage of a selected memory cell MCAi based upon a program state of an adjacent memory cell MCBi. Offset values $V_{offset1}$ to $V_{offset3}$ used to adjust a pre-charge voltage level are used as coupling compensation parameters for compensating the coupling due to an adjacent memory cell MCBi.

Figure 14:
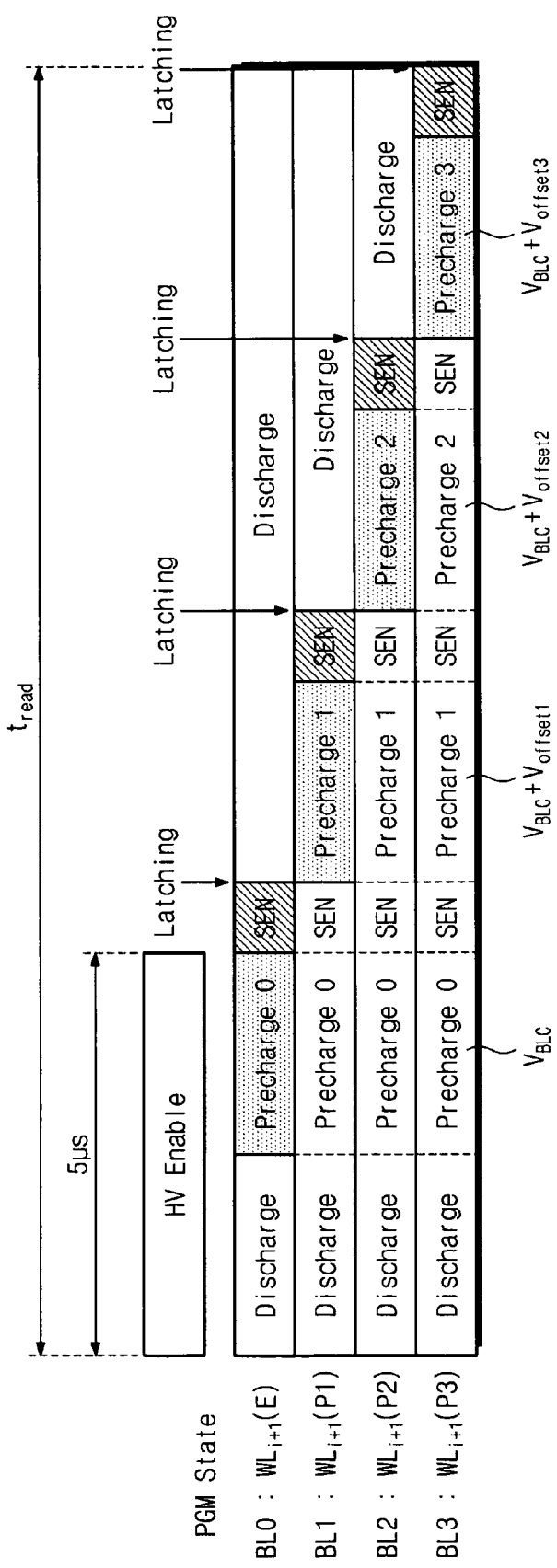

FIG. 14 shows an embodiment in which pre-charge and sensing periods are repeated with respect to selected memory cells and a latch operation is selectively made according to a data value of an adjacent memory cell.

Referring to FIG. 14, the first pre-charge period Precharge0 and a sensing period SEN are made with respect to all of selected memory cells (e.g., memory cells corresponding to one page). A data latch operation is selectively made with respect to a memory cell adjacent to a memory cell having an 'E' state. A further latch operation is not made with respect to a memory cell whose latch operation is made.

The second pre-charge period Precharge1 and a sensing period SEN are made with respect to all of selected memory cells or ones, not experiencing a latch operation, of the selected memory cells. A data latch operation is selectively made with respect to a memory cell adjacent to a memory cell having a 'P1' state. Successively, the third pre-charge period Precharge2 and a sensing period SEN are made with respect to all of selected memory cells or ones, not experiencing a latch operation, of the selected memory cells. A data latch operation is selectively made with respect to a memory cell adjacent to a memory cell having a 'P2' state. The fourth pre-charge period Precharge3 and a sensing period SEN are made with respect to all of selected memory cells or ones, not experiencing a latch operation, of the selected memory cells. A data latch operation is selectively made with respect to a memory cell adjacent to a memory cell having a 'P3' state.

Read methods described in FIGS. 13 and 14 may be performed by, for example, a software operation for determining the latch timing because a data value of a selected memory cell MCAi is latched according to a program state of an adjacent memory cell MCBi. If a sensing time allotted to a read operation is not sufficient to perform a software operation, there is made a read operation using the following repetitive sensing scheme.

The read methods described in FIGS. 13 and 14 correspond to the case that a pre-charge voltage level is applied as a coupling compensation parameter to a read method illustrated in FIG. 5. In case of this method, a software operation is needed to determine the timing of latching a data value of a selected memory cell MCAi according to a program state of an adjacent memory cell MCBi. If a sensing time allotted to a read operation is not sufficient to perform a software operation, there is made a read operation using the following repetitive sensing scheme.

Figure 15:
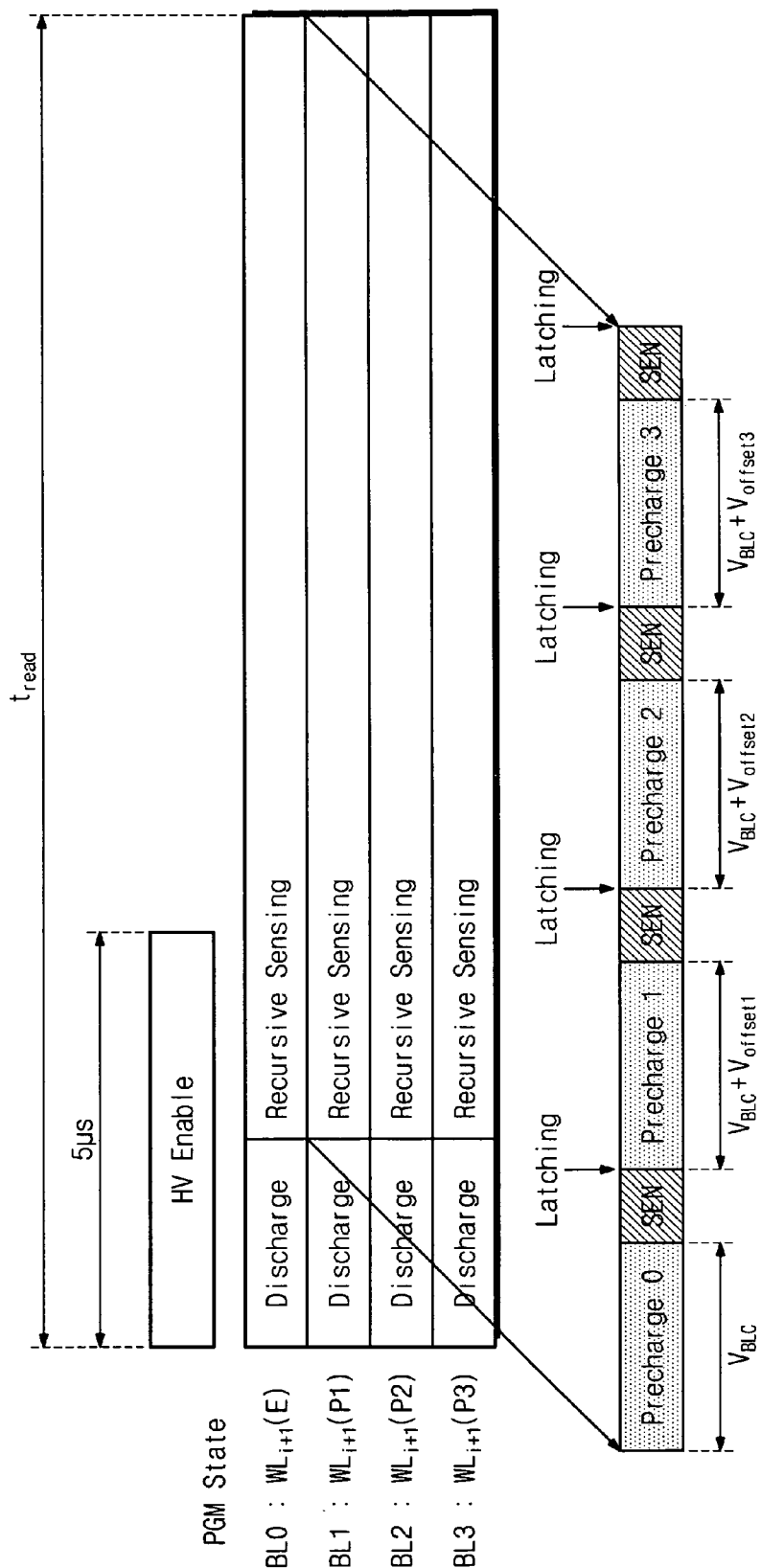

FIG. 15 shows a read method where a level of a bit line pre-charge voltage is adjusted according to a data value programmed in an adjacent memory cell and the coupling effect due to an adjacent memory cell is compensated via a repetitive latch operation. A read method illustrated in FIG. 15 corresponds to the case that a pre-charge voltage level is applied as a coupling compensation parameter to a read method illustrated in FIG. 6.

Referring to FIG. 15, a pre-charge operation and a sensing operation are repeated by a predetermined number with respect to a plurality of memory cells connected with a selected word line WLi. For example, in a case where each memory cell is programmed to have one of four threshold voltage distributions E, P1, P2, and P3, four pre-charge periods Precharge0 to Precharge3, having different pre-charge voltage levels, and four sensing periods SEN corresponding thereto are repeated. Sensed data is latched at a point of time when each sensing period is ended. At this time, a pre-charge voltage level applied to each of the pre-charge periods Precharge0 to Precharge3 is identical to that described in FIG. 13. The more the number of data bits stored per cell, the more the repeated number of pre-charge and sensing operations.

In accordance with a read method illustrated in FIG. 15, each of page buffers connected with respective bit lines repetitively conducts a plurality of pre-charge operations, to which different pre-charge voltage levels are applied, and sensing and latch operations corresponding thereto. No software operation is needed which is used to determine, before a latch operation, whether or a sensing result of a selected memory cell MCAi is latched according to a data value of an adjacent memory cell MCBi. It is possible to do accurate reading via compensation of the coupling effect although a sensing time allotted to a read operation is not sufficient to conduct a software operation.

Figure 16:
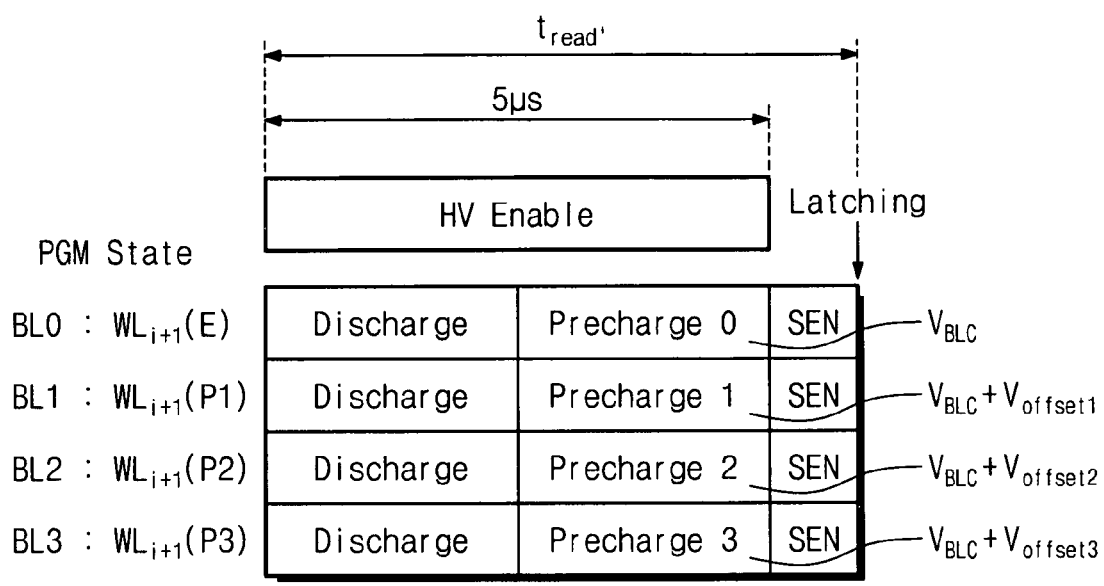

FIG. 16 shows a read method where pre-charge voltage levels of respective bit lines are simultaneously adjusted according to a data value programmed in an adjacent memory cell.

Referring to FIG. 16, if each memory cell is programmed to have one of four threshold voltage distributions E, P1, P2, and P3, a bit line connected with each memory cell is pre-charged with one of four pre-charge voltages $V_{BLC}$, $V_{BLC}+V_{offset1}$, $V_{BLC}+V_{offset2}$, and $V_{BLC}+V_{offset3}$ according to a program state of an adjacent memory cell at a read operation. One pre-charge operation, one sensing operation, and one latch operation are made with respect to each bit line, respectively. The pre-charge voltages $V_{BLC}$, $V_{BLC}+V_{offset1}$, $V_{BLC}+V_{offset2}$, and $V_{BLC}+V_{offset3}$ applied to respective pre-charge periods Precharge0 to Precharge3 are identical to those described in FIG. 13.

In particular, in case of a read method illustrated in FIG. 16, a pre-charge operation and a sensing and latch operation are conducted at one time with respect to all of selected memory cells (for example, memory cells in one page). Accordingly, a read time $t_{read'}$ is remarkably reduced as compared with an above-described read method. For example, a precharge and sense time of read time $t_{read'}$ is reduced, for example, by three quarters. This necessitates the construction for controlling a pre-charge voltage level to be applied to each bit line according to a program state of an adjacent memory cell.

Figure 17:
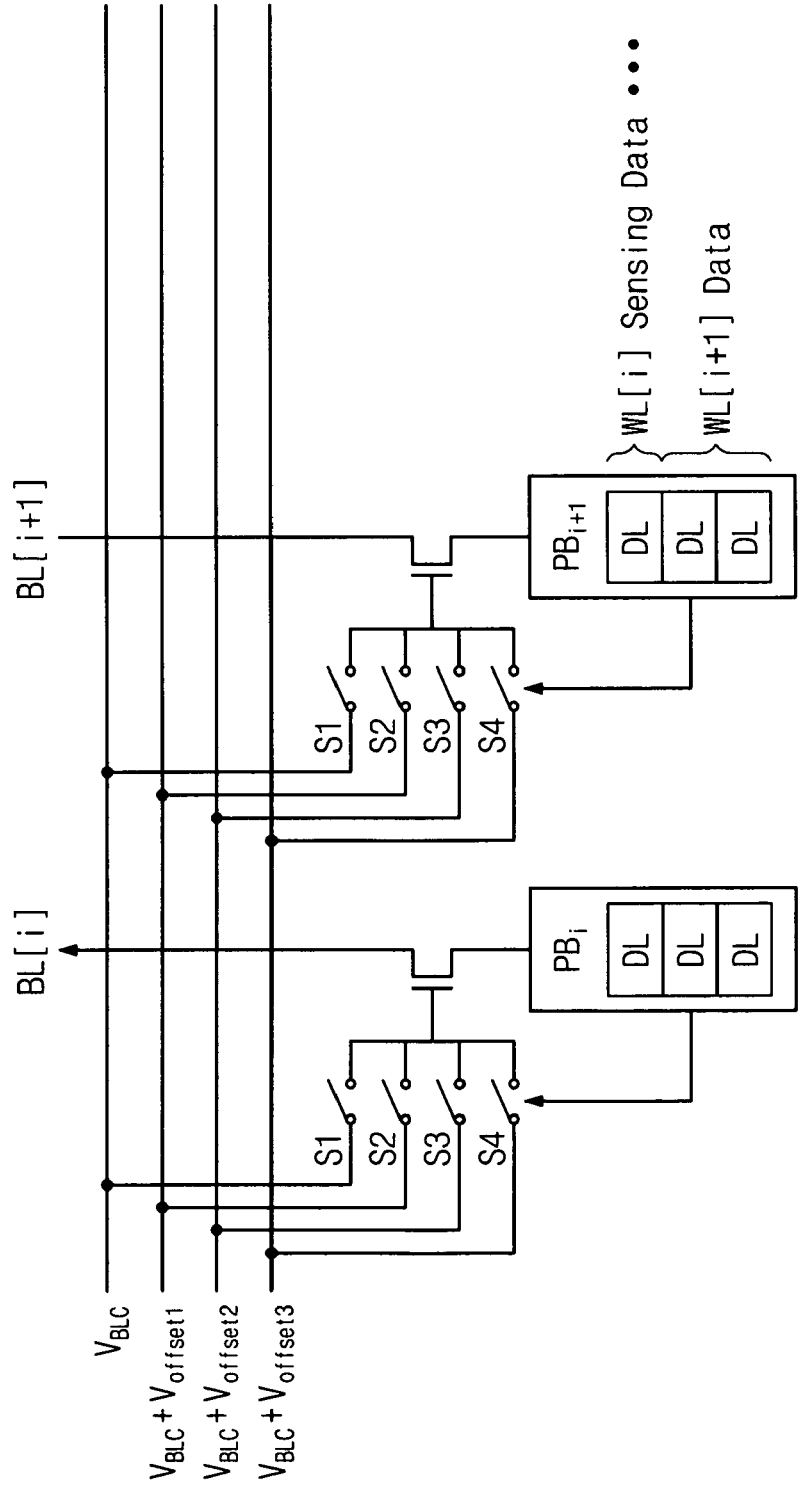

FIG. 17 is a diagram for describing a method of applying a bit line pre-charge voltage in order to execute a read method illustrated in FIG. 16.

Referring to FIG. 17, bit lines BL[i] and BL[i+1] are connected with corresponding page buffers PBi and PBi+1, respectively. Each of the page buffers PBi and PBi+1 has a plurality of, for example, three or more data latches DL. At least one of the data latches DL in each page buffer stores a data value of an adjacent memory cell MCBi connected with an adjacent word line WLi+1. A data value programmed in an adjacent memory cell MCBi is stored before a read operation of a selected memory cell is conducted. As will be more fully described below, a data value programmed in an adjacent memory cell MCBi is used to determine a pre-charge voltage level of a bit line connected with each of selected memory cells MCAi. The determined pre-charge voltage is used to read data from a selected memory cell MCAi. A data value of a memory cell MCAi connected with a selected word line WLi is stored in at least one of a plurality of data latches DL in a corresponding page buffer.

A level of a pre-charge voltage to be supplied to each bit line is determined as follows.

At a read operation of a memory cell MCAi connected with a selected word lien WLi, any one of a plurality of pre-charge voltages $V_{BLC}$, $V_{BLC}+V_{offset1}$, $V_{BLC}+V_{offset2}$, and $V_{BLC}+V_{offset3}$ can be applied to each of bit lines BL[i] and BL[i+1]. The pre-charge voltages $V_{BLC}$, $V_{BLC}+V_{offset1}$, $V_{BLC}+V_{offset2}$, and $V_{BLC}+V_{offset3}$ can be provided from a voltage generator circuit (not shown) which is embodied in a flash memory. Alternatively, the pre-charge voltages $V_{BLC}$, $V_{BLC}+V_{offset1}$, $V_{BLC}+V_{offset2}$, and $V_{BLC}+V_{offset3}$ can be supplied by dividing an internal voltage which is generated from a voltage generator circuit in a flash memory.

A data value of an adjacent memory cell MCBi stored in each page buffer is used as a selection signal for selecting a pre-charge voltage to be supplied to a corresponding bit line. Each of the page buffers PBi and PBi+1 has a plurality of switches S1 to S4 for switching a plurality of pre-charge voltages, and one pre-charge voltage selected via the switches S1 to S4 is applied to a corresponding bit line.

The switches S1 to S4 are controlled by a data value of an adjacent memory cell MCBi stored in each of the page buffers PBi and PBi+1. For example, in a case where a data value of an adjacent memory cell MCBi is 'E', the switch S1 is turned on, and the remaining switches S2 to S4 are turned off. This makes the first pre-charge voltage $V_{BLC}$ be applied to a corresponding bit line. If a data value of an adjacent memory cell MCBi is 'P1', the switch S2 is turned on, and the remaining switches S1, S3, and S4 are turned off. This makes the first pre-charge voltage $V_{BLC}+V_{offset1}$ be applied to a corresponding bit line. If a data value of an adjacent memory cell MCBi is 'P2', the switch S3 is turned on, and the remaining switches S1, S2, and S4 are turned off. This makes the first pre-charge voltage $V_{BLC}+V_{offset2}$ be applied to a corresponding bit line.

In the case that a data value of an adjacent memory cell MCBi is 'P3', the switch S4 is turned on, and the remaining switches S1 to S3 are turned off. This makes the first pre-charge voltage $V_{BLV}+V_{offset3}$ be applied to a corresponding bit line.

At this time, the pre-charge voltages $V_{BLC}$, $V_{BLC}+V_{offset1}$, $V_{BLC}+V_{offset2}$, and $V_{BLC}+V_{offset3}$ are applied to each bit line during the same pre-charge period. A pre-charged voltage of each bit line is sensed and latched via the same sensing period. That is, in accordance with a read method illustrated in FIG. 17, a plurality of selected memory cells are read at the same time via one pre-charge operation and one sensing and latch operation. An embodiment for compensating the coupling of an adjacent memory cell enables a read time to be reduced remarkably with a simple circuit configuration.

Figure 18:
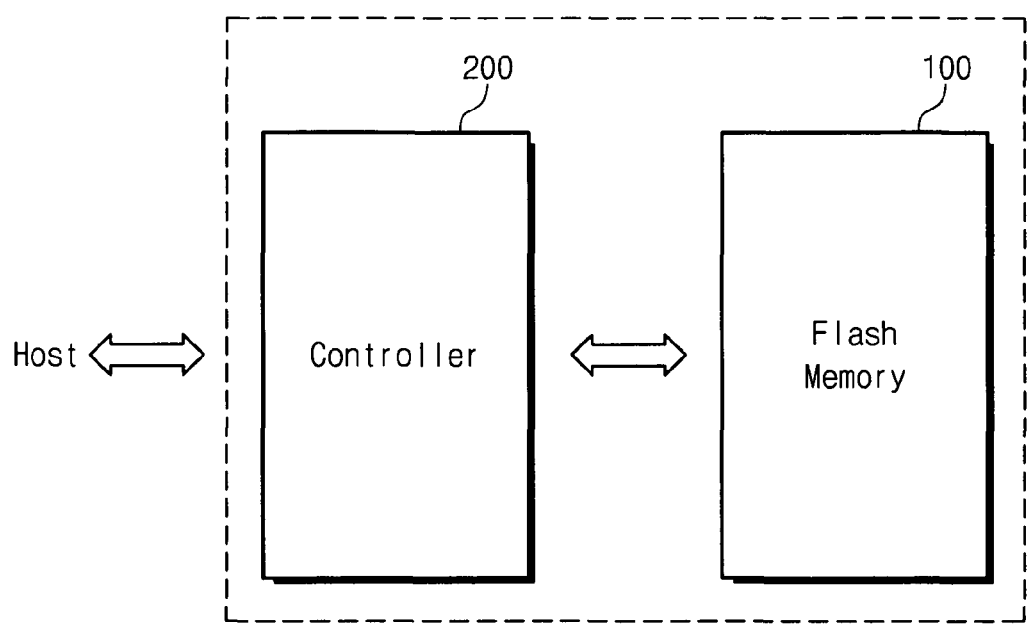
FIG. 18 is a diagram showing schematic configuration of a memory system including a flash memory device illustrated in FIG. 1.

FIG. 18 is a diagram showing a memory system including a flash memory device 100 illustrated in FIG. 1.

Referring to FIG. 18, a memory system according to an example embodiment includes a flash memory device 100 and a memory controller 200. The configuration of the flash memory device 100 is substantially identical to that illustrated in FIG. 1, and description thereof is thus omitted. The memory controller 200 is configured to control the flash memory device 100. Like an above-described read method, the flash memory device 100 compensates the coupling effect due to an adjacent memory cell by adjusting the length of a sensing period or a pre-charge level of a bit line according to a data state of the adjacent memory cell. In accordance with the read method, it is possible to effectively compensate the coupling effect caused between adjacent memory cells. Thus, the reliability of a read result can be promoted.

A memory system illustrated in FIG. 18 can be configured to for a memory card and/or a memory card system. In this case, the memory controller 200 may be configured to communicate with an external device (for example, a host) via one selected from a group of Universal Serial Bus (USB) interface, MultiMedia Card (MMC) interface, PCIExpress (PCI-E) interface, Serial AT Attachment (SATA) interface, Parallel AT Attachment (PATA) interface, Small Computer System Interface (SCSI) interface, Serial Attached SCSI (SAS) interface, Enhanced Small Disk Interface (ESDI), and Integrated Drive Electronics (IDE) interface, and the like.

In the meantime, flash memory devices are kinds of nonvolatile memories capable of keeping data stored therein even without power supply. With a rapid increase of using mobile apparatuses such as cellular phones, personal digital assistants (PDA), digital cameras, portable gaming consoles, and MP3, the flash memory devices are widely employed as code storage, as well as data storage. The flash memory devices may be also utilized in home applications such as high-definition TVs, digital versatile disks (DVDs), routers, and global positioning systems (GPSs).

Figure 19:
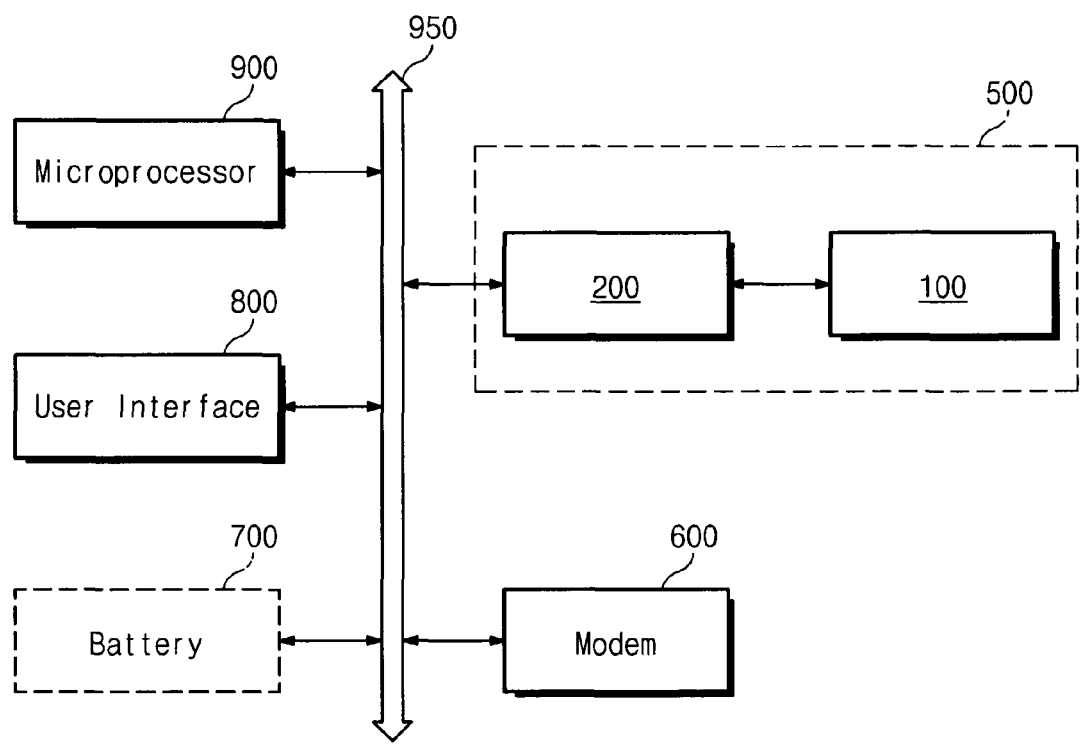
FIG. 19 is a diagram showing schematic configuration of a computing system including a flash memory device illustrated in FIG. 1.

FIG. 19 is a block diagram showing a schematic computing system including a flash memory device according to an example embodiment. The computing system is organized with including a processing unit 900 such as a microprocessor or a central processing unit, a user interface 800, a modem 600 such as a baseband chipset, a memory controller 200, and a flash memory device 100. The flash memory device 100 may be configured as like that shown FIG. 1 in substance. In the flash memory device 100, N-bit data (N is a positive integer) to be processed by the processing unit 900 are stored through the memory controller 200. Data stored in the flash memory device 100 compensates the coupling effect due to an adjacent memory cell by adjusting a sensing time or a level of a bit line pre-charge voltage according to the above-described read methods.

If the computing system shown in FIG. 19 is a mobile apparatus, it is further comprised of a battery 700 for supplying power thereto. Although not shown in FIG. 19, the computing system may be further equipped with an application chipset, a camera image processor (for example, CMOS image sensor; CIS), a mobile DRAM, and so on. The memory controller 200 and the flash memory device 100, for example, may be configured as, or for use with, a Solid State Drive/Disk (SSD) which uses a non-volatile memory to store data.

The flash memory device and/or the memory controller according to example embodiments can be packed in various types of packages. For example, The flash memory device and/or the memory controller according to example embodiments can be packed as one selected from a group of PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and so on.

In an example embodiment, memory cells can be formed using one of various cell structures each having a charge storage layer. The cell structures with the charge storage layer include a charge trap flash structure, a stack flash structure in which arrays are stacked in multi-layer, a source-drain free flash structure, a pin-type flash structure, and so one.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A read method of a flash memory device comprising:
   reading program states of first memory cells connected with a first word line; and
   reading second memory cells connected with a second word line adjacent to the first word line based on the program states of the first memory cells to generate a read result,
   wherein bit lines connected with the second memory cells are selectively pre-charged or discharged at the same time based on the program states of the first memory cells.

2. The read method of claim 1, further comprising:
   latching the read result of the second memory cells based on the program states of the first memory cells.

3. The read method of claim 1, wherein the reading the second memory cells comprises applying at least one of N different bit line pre-charge voltages to respective bit lines connected with the second memory cells, where N is a number of data values that can be stored in each of the first memory cells.

4. The read method of claim 3, wherein the reading second memory cells comprises applying a bit line discharge voltage to bit lines connected with cells from among the second memory cells that correspond to cells from among the first memory cells storing an erase state.

5. The read method of claim 4, wherein the bit line discharge voltage is a ground voltage.

6. A flash memory device comprising:
   a first word line configured to connect with a plurality of first memory cells;
   a second word line configured to connect with a plurality of second memory cells;
   bit lines configured to connect with the first and second memory cells, and configured to be selectively pre-charged or discharged at the same time based on a plurality of coupling compensation parameters during reading the second memory cells; and
   a pre-charge circuit configured to pre-charge or discharge the bit lines at a read operation.

7. The flash memory device of claim 6, wherein the coupling compensation parameters are determined according to data values stored in the first memory cells.

8. The flash memory device of claim 7, further comprising:
   a sense and latch circuit configured to latch a read result of the second memory cells based on the data values of the first memory cells.

9. The flash memory device of claim 6, wherein the pre-charge circuit is applies at least one of N different bit line pre-charge voltages to respective bit lines connected with the second memory cells, where N is a number of data values that can be stored in each of the first memory cells.

10. The flash memory device of claim 9, wherein the pre-charge circuit applies a bit line discharge voltage to bit lines connected with cells from among the second memory cells that correspond to cells from among the first memory cells storing an erase state.

11. A read method of a flash memory device comprising:
    reading program states of first memory cells connected with a first word line; and
    reading second memory cells connected with a second word line adjacent to the first word line using different bit line pre-charge voltages according to the program states of the first memory cells.

12. The read method of claim 11, wherein the reading the second memory cells comprises:
    pre-charging a plurality of bit lines each corresponding to the second memory cells using different bit line pre-charge voltages according to the program states of the first memory cells; and
    sensing program states of the second memory cells.

13. The read method of claim 12, wherein the pre-charging the plurality of bit lines comprises applying at least one of N different bit line pre-charge voltages to respective bit lines connected with the second memory cells, where N is a number of data values that are stored in each of the first memory cells.

14. The read method of claim 13, wherein the reading second memory cells comprises:
    selecting one of the N bit line pre-charge voltages as a bit line pre-charge voltage to be applied to each bit line;
    simultaneously applying the selected bit line pre-charge voltages of the respective bit lines to the bit lines; and
    sensing, as results sensed by the N sensing operations, voltages of the bit lines after a reference sensing period elapses.

15. The read method of claim 13, wherein the bit line pre-charge voltages of the respective bit lines are selected by a bit line unit based on sensed results of adjacent memory cells.

16. The read method of claim 13, wherein the reading the second memory cells comprises latching the program states of the second memory cells based on the program states of the first memory cells.

17. The read method of claim 11, wherein the reading the second memory cells comprises:
applying one of N bit line pre-charge voltages to the bit lines each corresponding to the second memory cells; and
sensing, as results sensed by the N sensing operations, voltages of the bit lines after a reference sensing period elapses.

18. The read method of claim 17, wherein the reading the second memory cells further comprises:
re-applying one of the N bit line pre-charge voltages to the bit lines each corresponding to the second memory cells, after the sensing; and
re-sensing, as results sensed by the N sensing operations, voltages of the bit lines after a reference sensing period elapses.

19. The read method of claim 18, wherein the re-applying and the re-sensing are not conducted with respect to memory cells, whose sensed results are latched, of the second memory cells.

20. The read method of claim 11, wherein the reading second memory cells comprises:
sensing program states of the second memory cells one or more times using a plurality of coupling compensation parameters; and
latching the program states of the second memory cells based on the program states of the first memory cells,
wherein the coupling compensation parameters are a plurality of levels of a bit line pre-charge voltage to be used at a read operation.

* * * * *